US012772610B2

(12) United States Patent
Bang et al.

(10) Patent No.: US 12,772,610 B2
(45) Date of Patent: Oct. 20, 2026

(54) DISPLAY DEVICE

(71) Applicant: LG ELECTRONICS INC., Seoul (KR)

(72) Inventors: Hyungseok Bang, Seoul (KR); Hyungjo Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 562 days.

(21) Appl. No.: 18/035,035

(22) PCT Filed: Nov. 2, 2021

(86) PCT No.: PCT/KR2021/015642
§ 371 (c)(1),
(2) Date: May 2, 2023

(87) PCT Pub. No.: WO2022/098035
PCT Pub. Date: May 12, 2022

(65) Prior Publication Data

US 2023/0402567 A1 Dec. 14, 2023

(30) Foreign Application Priority Data

Nov. 3, 2020 (KR) ........................ 10-2020-0145184

(51) Int. Cl.
*H10H 20/814* (2025.01)
*H10H 20/851* (2025.01)
*H10W 90/00* (2026.01)

(52) U.S. Cl.
CPC .... *H10H 20/8142* (2025.01); *H10H 20/8514* (2025.01); *H10W 90/00* (2026.01)

(58) Field of Classification Search
CPC ........... H10H 20/8142; H10H 20/8514; H10H 20/862; H10H 20/8513; H10H 20/851; H01L 25/0753; H01L 25/167
See application file for complete search history.

(56) References Cited

U.S. PATENT DOCUMENTS 10,620,504 B2 4/2020 Jain
12,124,062 B2 * 10/2024 Kawashita ........ G02F 1/133521
(Continued)

FOREIGN PATENT DOCUMENTS

JP 2020-113384 A 7/2020
KR 10-2013-0125241 A 11/2013
(Continued)

OTHER PUBLICATIONS

International Search Report for PCT/KR2021/015642 mailed on Feb. 28, 2022.

*Primary Examiner* — Sonji N Johnson
(74) *Attorney, Agent, or Firm* — Birch, Stewart, Kolasch & Birch, LLP

(57) ABSTRACT

A display device comprises a substrate including a first sub-pixel, a second sub-pixel, and a third sub-pixel, the first sub-pixel, the second sub-pixel, and the third sub-pixel constituting a pixel, a first light resonance structure disposed in the first sub-pixel and configured to emit a first light using a first light resonance mode, a second light resonance structure disposed in the second sub-pixel and configured to emit a second light using a second light resonance mode, and a third light resonance structure disposed in the third sub-pixel and configured to emit a third light using a third light resonance mode.

18 Claims, 20 Drawing Sheets

(56) References Cited

U.S. PATENT DOCUMENTS

| | | | | |
|---|---|---|---|---|
| 2013/0301278 | A1 | 11/2013 | Choi et al. | |
| 2015/0171379 | A1 | 6/2015 | Min | |
| 2020/0220108 | A1 | 7/2020 | Irobe et al. | |
| 2020/0243800 | A1 * | 7/2020 | Joo | H10K 59/35 |
| 2021/0234112 | A1 | 7/2021 | Seo et al. | |

FOREIGN PATENT DOCUMENTS

| | | | | |
|---|---|---|---|---|
| KR | 10-2015-0069875 | A | 6/2015 | |
| KR | 10-2019-0137742 | A | 12/2019 | |
| KR | 10-2020-0013884 | A | 2/2020 | |
| KR | 20200013884 | A * | 2/2020 | G02B 27/01 |
| WO | WO 2019/234562 | A1 | 12/2019 | |

* cited by examiner

DISPLAY DEVICE

CROSS REFERENCE TO RELATED APPLICATIONS

This application is the National Phase of PCT International Application No. PCT/KR2021/015642, filed on Nov. 2, 2021, which claims priority under 35 U.S.C. 119(a) to Patent Application No. 10-2020-0145184, filed in the Republic of Korea on Nov. 3, 2020, all of which are hereby expressly incorporated by reference into the present application.

TECHNICAL FIELD

The embodiment relates to a display device.

BACKGROUND ART

A display device is employed in various fields. In particular, in recent years, the augmented reality (AR)-based display field or the vehicle head-up display (HUD) field as well as the display field for a TV is in the great spotlight.

The AR or HUD display device requires super high resolution. To this end, a display device that displays an image using a light emitting diode having high luminance and a small size as a light source for a pixel is in the spotlight.

FIG. 1 is a cross-sectional view showing the related art display device.

Referring to FIG. 1, A light emitting diode 2 that emits light of the same color are disposed on each sub-pixel of a lower substrate 1. The light emitting diode 2 is used as a light source. A color filter 5 and a color conversion layer 3 are disposed on each sub-pixel of an upper substrate 7. Barrier ribs 4 and 6 are disposed between these sub-pixels. In this case, the lower substrate 1 and the upper substrate 7 are located to face each other and then bonded to each other.

In the related art display device, the light emitting diode 2, the color conversion layer 3, and the color filter 5 are disposed on each sub-pixel in this order. After light from the light emitting diode 2 is color-converted by the color conversion layer 3, light corresponding to a wavelength of a specific band is emitted by the color filter 5.

However, the related art display device has the following problems.

Usually, a phosphor or quantum dot is used for the color conversion layer 3.

When a phosphor, particularly an inorganic phosphor, is used for the color conversion layer 3, the inorganic phosphor has relatively a large size. When the size of the sub-pixel is reduced, it is difficult to appropriately include an inorganic phosphor having a large size in the reduced sub-pixel. For example, the inorganic phosphor is added to a binder mixed with resin, solvent, and additives, and it is applied on the upper substrate 7 in the form of a paste. In this case, the inorganic phosphor exists in different numbers for each sub-pixel in the applied paste. Therefore, there is a problem in that the color conversion rate is different for each sub-pixel.

When an organic phosphor or a quantum dot is used as the color conversion layer 3, there is a problem in that these organic phosphor or quantum dot is vulnerable to life. For example, light having high energy is emitted from the light emitting diode 2. When the organic phosphor or the quantum dot is continuously exposed to high-energy light, there is a problem in that material properties are deformed and then optical properties are deteriorated.

On the other hand, since AR or HUD must be installed in a small space due to the specificity of installation, compactness such as thickness reduction is urgently required.

DISCLOSURE

Technical Problem

An object of the embodiment is to solve the foregoing and other problems.

Another object of the embodiment is to provide a display device capable of being compact.

Another object of the embodiment is to provide a display device capable of obtaining super high resolution.

The technical problem of the embodiment is not limited to those described in this section, and include those that can be grasped through the description of the invention.

Technical Solution

According to one aspect of the embodiment to achieve the above or other object, a display device, comprising: a substrate including a first sub-pixel, a second sub-pixel, and a third sub-pixel, the first sub-pixel, the second sub-pixel, and the third sub-pixel constituting a pixel; a first light resonance structure disposed in the first sub-pixel and configured to emit a first light using a first light resonance mode; a second light resonance structure disposed in the second sub-pixel and configured to emit a second light using a second light resonance mode; and a third light resonance structure disposed in the third sub-pixel and configured to emit a third light using a third light resonance mode.

The first light resonance structure may comprise: a first light resonance mode generator; and a first light generator in the first light resonance mode generator. The first light resonance mode generator may comprise: a 1-1 reflective layer on the substrate; and a 1-2 reflective layer on the 1-1 reflective layer. The first light generator may be disposed between the 1-1 reflective layer and the 1-2 reflective layer.

The second light resonance structure may comprise: a second light resonance mode generator; a second light generator in the first light resonance mode generator; and a first color converter on the second light generator. The second light resonance mode generator may comprise: a 2-1 reflective layer on the substrate; and a 2-2 reflective layer on the 2-1 reflective layer. The second light generator may be disposed between the 2-1 reflective layer and the 2-2 reflective layer. The first color converter may be disposed between the second light generator and the 2-2 reflective layer.

The third light resonance structure may comprise: a third light resonance mode generator; a third light generator in the third light resonance mode generator; and a second color converter on the third light generator. The third light resonance mode generator may comprise: a 3-1 reflective layer on the substrate; and a 3-2 reflective layer on the 3-1 reflective layer. The third light generator is disposed between the 3-1 reflective layer and the 3-2 reflective layer. The second color converter may be disposed between the third light generator and the 3-2 reflective layer.

The 1-2 reflective layer, the 2-2 reflective layer and the 3-2 reflective layer may include a DBR structure.

An anti-node of the first light resonance mode may be located in an active layer of each of the first light generator, the second light generator, and the third light generator.

The anti-node of the first light resonance mode may be located in the 1-1 color conversion layer of the first color converter, and a node of the first light resonance mode may be located in the 1-2 color conversion layer of the first color converter.

An anti-node of the second light resonance mode may be located in the 1-1st color conversion layer of the first color converter.

An anti-node of the first light resonance mode may be located in a second color conversion layer of the second color converter, and an anti-node of the third light resonance mode may be located in a second color conversion layer of the second color converter.

The first light generator, the second light generator, and the third light generator may comprise a connection part. At least one semiconductor layer of the first conductivity type semiconductor layer or the second conductivity type semiconductor layer of the first light generator, the second light generator, and the third light generator may be commonly connected by the connection part.

The first light resonance structure, the second light resonance structure, and the third light resonance structure may include a high refractive region located at the center thereof.

The first light resonance structure, the second light resonance structure, and the third light resonance structure may include a total reflection layer located on a side portion thereof.

The first light may include blue light, the second light may include green light, and the third light may include red light.

Advantageous Effects

As shown in FIGS. 6 to 9, in the embodiment, a first light resonance structure 310, a second light resonance structure 320, and a third light resonance structure 330 are included. The first light resonance structure 310 emits a first light 560, the second light resonance structure 320 emits a second light 570, and the third light resonance structure 330 emits a third light 580. Since the first light resonance structure 310, the second light resonance structure 320, and the third light resonance structure 330 have structures capable of forming the first to third light resonance modes 510, 520, and 530, respectively, luminance can be improved.

For example, in the first light resonance structure 310, a first light generator 312 may generate a first light 560, and a first light resonance mode generator may include a 1-1 reflective layer 311 and a 1-2 reflective layer 314. A first light resonance mode 510 may be formed between the 1-1 reflective layer 311 and the 1-2 reflective layer 314. In this case, since an anti-node of the first light resonance mode 510 is located in an active layer 3120 of the first light generator 312, the energy of the first light 560 amplified by the first light resonance mode 510 may be maximally transferred to the active layer 3120 of the first light generator 312. Accordingly, since the active layer 3120 of the first light generator 312 generates a larger amount of light, the first light 560 with improved luminance can be emitted.

For example, in the second light resonance structure 320, a second light generator 322 may generate the first light 560, and a first color converter 323 may convert the first light 560 into a second light 570. Also, a second light resonance mode generator may include a 2-1 reflective layer 321 and a 2-2 reflective layer 324. the first light resonance mode 510 and a second light resonance mode 520 may be formed between the 2-1 reflective layer 321 and the 2-2 reflective layer 324. In this case, an anti-node of the first light resonance mode 510 may be located in an active layer 3220 of the second light generator 322 and a 1-1 color conversion layer 3234 of the first color converter 323. Accordingly, since the energy of the first light 560 amplified by the first light resonance mode 510 is maximally transferred to the active layer 3220 of the second light generator 322, the amount of light of the first light 560 generated by the second light generator 322 may be further increased. In addition, since the energy of the amplified first light 560 is maximally transferred to the 1-1 color conversion layer 3234 of the first color converter 323, the conversion efficiency from the first light 560 to the second light 570 in the 1-1 color conversion layer 3234 may be improved. Meanwhile, an anti-node of the second light resonance mode 520 may be located in the 1-1 color conversion layer 3234 of the first color converter 323. Accordingly, since the energy of the amplified first light 560 is absorbed by the 1-1 color conversion layer 3234, the conversion efficiency to (570) from the first light 560 to the second light 570 in the 1-1 color conversion layer 3234 can be improved. Therefore, since the amount of light of the second light 570 converted by the first color converter 323 is further increased, the second light 570 with improved luminance can be emitted.

For example, in the third light resonance structure 330, a third light generator 332 may generate the first light 560, and the second color converter 333 may convert the first light 560 into a third light 580.

In addition, the third light resonance mode generator may include a 3-1 reflective layer 331 and a 3-2 reflective layer 334. The first light resonance mode 510 and the third light resonance mode 530 may be formed between the 3-1 reflective layer 331 and the 3-2 reflective layer 334. In this case, the anti-node of the first light resonance mode 510 may be located in an active layer 3320 of the third light generator 332 and a second color conversion layer 3332 of the second color converter 333. Accordingly, since the energy of the first light 560 amplified by the first light resonance mode 510 is maximally transferred to the active layer 3320 of the third light generator 332, the amount of light of the generated first light 560 in the third light generator 332 may be further increased. In addition, since the energy of the amplified first light 560 is maximally transferred to the second color conversion layer 3332 of the second color converter 333, the conversion efficiency from the first light 560 to the third light 580 in the second color conversion layer 3332 may be improved. Meanwhile, an anti-node of the third light resonance mode 530 may be located in the second color conversion layer 3332 of the second color converter 333. Accordingly, since energy of the amplified first light 560 is absorbed by the second color conversion layer 3332, the conversion efficiency from the first light 560 to the third light 580 in the second color conversion layer 3332 can be improved. Therefore, since the amount of light of the third light 580 converted by the second color converter 333 is further increased, the third light 580 with improved luminance can be emitted.

As described above, the 1-1 color conversion layer 3234 of the first color converter 323 is located at the anti-node of the first light resonance mode 510 as well as the anti-node of the second light resonance mode 520. Accordingly, since all of the first light 560 generated by the second light generator 322 is used to be converted into the second light 570, and it may not be emitted to the outside through the first color converter 323. Therefore, color mixing defects between the first light 560 and the second light 570 can be prevented. Also, the second color conversion layer 3332 of the second color converter 333 may be located at the anti-node of the third light resonance mode 530 as well as the anti-node of the first light resonance mode 510. Accordingly, all of the first light 560 generated by the third light generator 332 is used to be converted into the third light 580, and it may not be emitted to the outside through the second color converter 333. Therefore, color mixing defects between the first light 560 and the third light 580 can be prevented.

In addition, the first light 560 in the first light resonance structure 310 may propagate in a vertical direction by the first light resonance mode 510, and the second light 570 in the second light resonance structure 320 may propagate in a vertical direction by the second light resonance mode 520, and the third light 580 in the third light resonance structure 330 may propagate in a vertical direction by the third light resonance mode 530. Accordingly, since the first light 560, the second light 570, and the third light 580 is not emitted in the lateral direction through side portions of the first light resonance structure 310, the second light resonance structure 320, and the third light resonance structure 330, respectively, color mixing defects between sub-pixels can be prevented and light loss in the lateral direction can be prevented.

Also, the first light resonance structure 310, the second light resonance structure 320, and the third light resonance structure 330 may be spaced apart from each other in space. Total reflection layers 3237 and 3337 may be coated on sidewalls of the first light resonance structure 310, the second light resonance structure 320, and the third light resonance structure 330, respectively. Accordingly, since the first light 560, the second light 570, and the third light 580 emitted from the first light resonance structure 310, the second light resonance structure 320, and the third light resonance structure 330 are not emitted in the lateral direction through side portions of the first light resonance structure 310, the second light resonance structure 320, and the third light resonance structure 330, respectively, there is no need to form a separate barrier rib, and thus the structure is simple and it is possible to implement a high-resolution and high-definition display.

In addition, since the high refractive regions 361, 362, and 363 that limit the light resonance mode in the horizontal direction are provided in the first light resonance structure 310, the second light resonance structure 320 and the third light resonance structure 330, respectively, the light efficiency can be improved and the luminance can be increased by further activating the light resonance mode in the vertical direction.

A further scope of applicability of the embodiment will become apparent from the detailed description that follows. However, since various changes and modifications within the spirit and scope of the embodiment can be clearly understood by those skilled in the art, it should be understood that the detailed description and specific embodiment, such as preferred embodiment, are given by way of example only.

Figure 1:
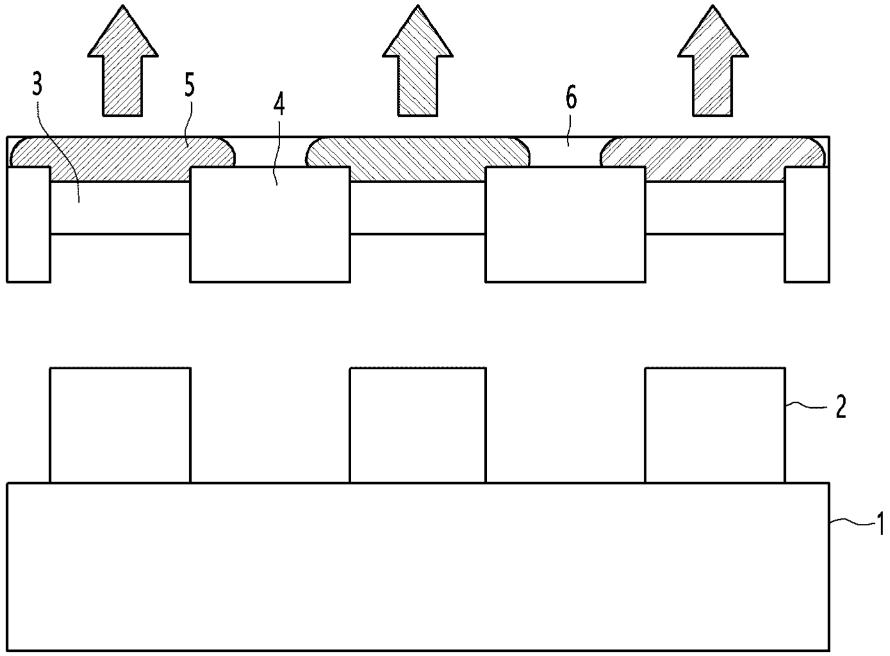
FIG. 1 Related Art
FIG. 1 is a cross-sectional view showing the related art display device.

The sizes, shapes, dimensions, etc. of elements shown in the drawings may differ from actual ones. In addition, even if the same elements are shown in different sizes, shapes, dimensions, etc. between the drawings, this is only an example on the drawing, and the same elements have the same sizes, shapes, dimensions, etc. between the drawings.

MODE FOR INVENTION

Hereinafter, the embodiment disclosed in this specification will be described in detail with reference to the accompanying drawings, but the same or similar elements are given the same reference numerals regardless of reference numerals, and redundant descriptions thereof will be omitted. The suffixes 'module' and 'unit' for the elements used in the following descriptions are given or used interchangeably in consideration of ease of writing the specification, and do not themselves have a meaning or role that is distinct from each other. In addition, the accompanying drawings are for easy understanding of the embodiment disclosed in this specification, and the technical idea disclosed in this specification is not limited by the accompanying drawings. Also, when an element such as a layer, region or substrate is referred to as being 'on' another element, this means that there may be directly on the other element or be other intermediate elements therebetween.

The display device described in this specification may comprise TV, the signage, a mobile phone, a smart phone, a head-up display (HUD) for a vehicle, a backlight unit for a laptop computer, a display for VR or AR, and the like. However, the configuration according to the embodiment described in this specification can be applied to a display capable device even if it is a new product type to be developed in the future.

Hereinafter, a light emitting device according to an embodiment and a display device including the light emitting device will be described.

Figure 2:
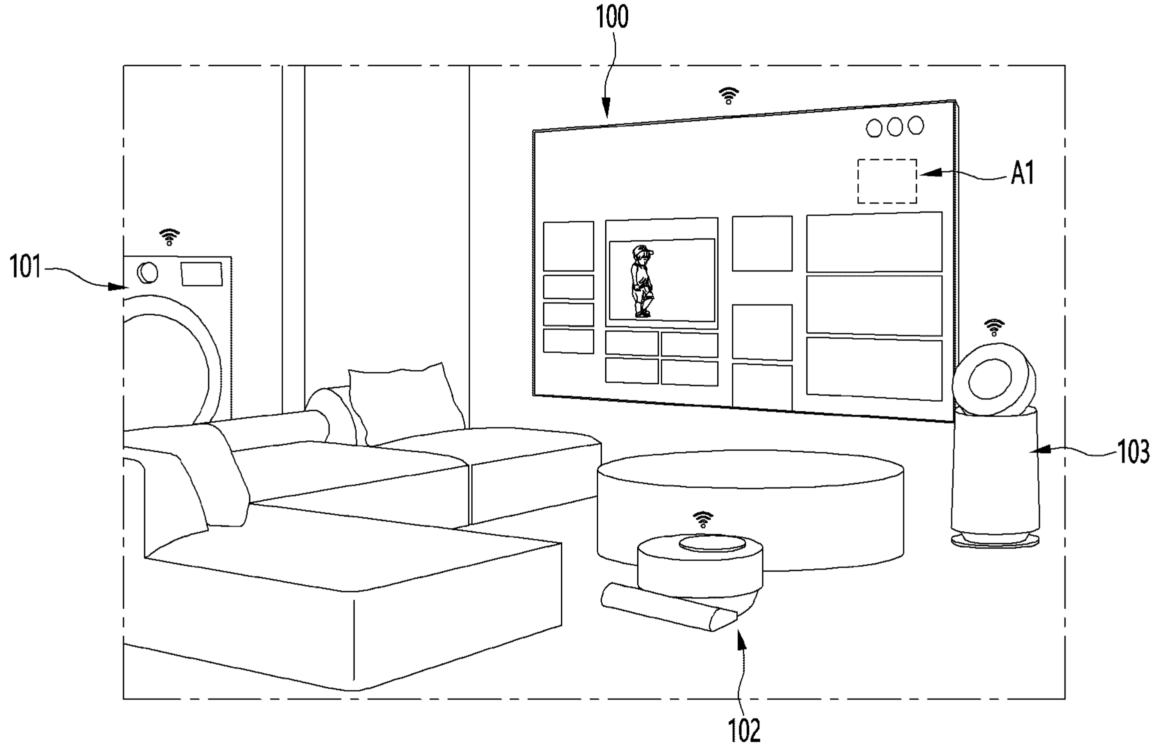
FIG. 2 illustrates a living room of a house in which a display device according to an embodiment is disposed.

FIG. 2 illustrates a living room of a house in which a display device according to an embodiment is disposed.

Referring to FIG. 2, the display device 100 of the embodiment may display the status of various electronic products such as a washing machine 101, a robot cleaner 102, and an air purifier 103, communicate with each electronic product based on IOT and control each electronic product based on user's setting data.

The display device 100 according to the embodiment may include a flexible display fabricated on a thin and flexible substrate. The flexible display may be bent or rolled like paper while maintaining the characteristics of an existing flat panel display.

In the flexible display, visual information can be implemented by independently controlling light emission of a unit pixel arranged in a matrix form. The unit pixel means a minimum unit for implementing one color. The unit pixel of the flexible display may be implemented by a light emitting device. In the embodiment, the light emitting device may be Micro-LED or Nano-LED, but is not limited thereto.

Figure 3:
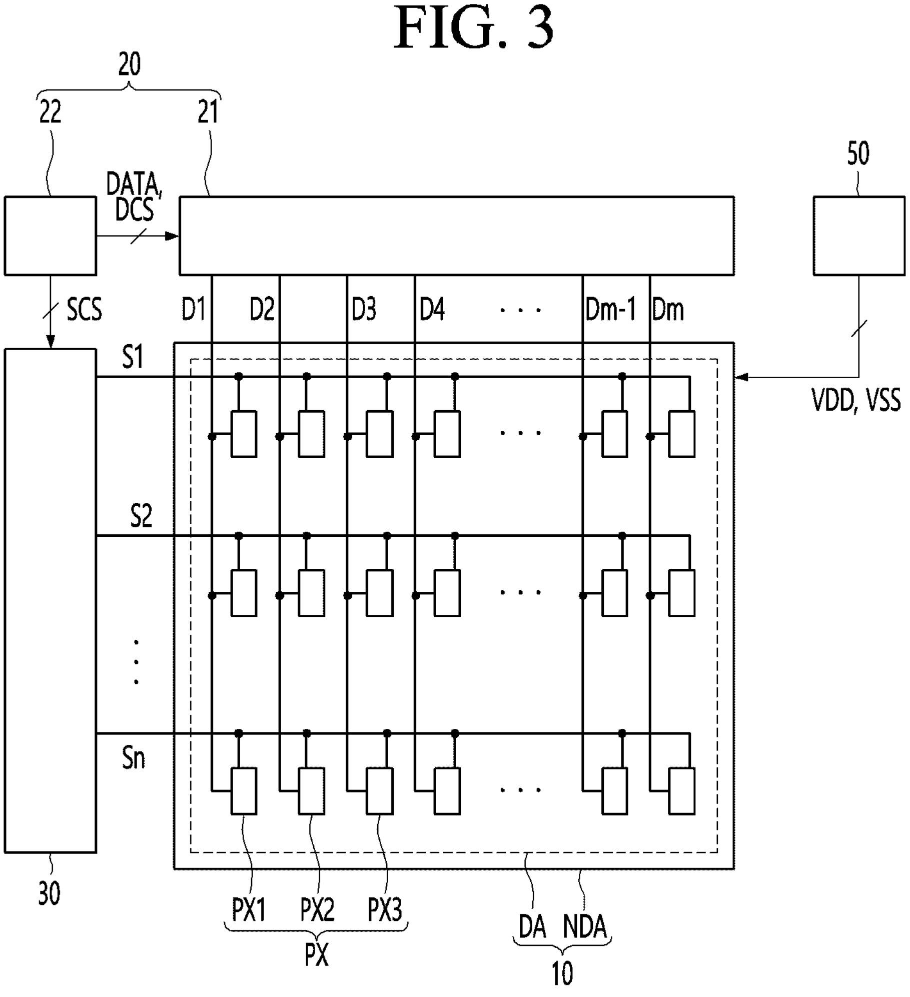
FIG. 3 is a block diagram schematically illustrating a display device according to an embodiment.
Figure 4:
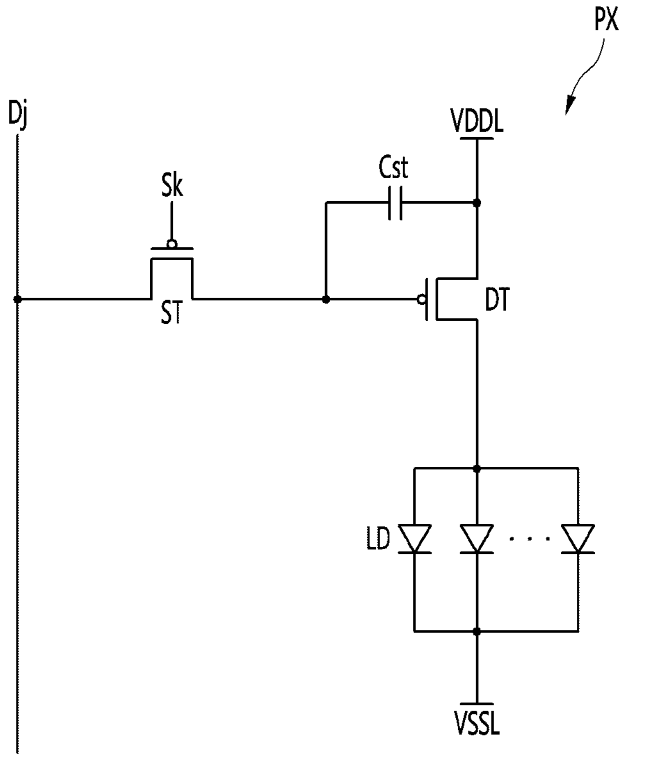
FIG. 4 is a circuit diagram showing an example of a pixel of FIG. 3.

FIG. 3 is a block diagram schematically illustrating a display device according to an embodiment. FIG. 4 is a circuit diagram showing an example of a pixel of FIG. 3.

Referring to FIG. 3 and FIG. 4, a display device according to an embodiment may comprise a display panel 10, a driving circuit 20, a scan driving circuit 30 and a power supply circuit 50.

The display device 100 of the embodiment may drive a light emitting device in an active matrix (AM) scheme or a passive matrix (PM) scheme.

The driving circuit 20 may comprise a data driving circuit 21 and a timing controller 22.

The display panel 10 may have a rectangular shape, but is not limited thereto. That is, the display panel 10 may be formed in a circular or elliptical shape. At least one side of the display panel 10 may be formed to be bent with a predetermined curvature.

The display panel 10 may be divided into a display area DA and a non-display area NDA disposed around the display area DA. The display area DA is an area where the pixels PX are formed to display an image. The display panel 10 may comprise data lines (D1 to Dm, where m is an integer greater than or equal to 2), scan lines (S1 to Sn, where n is an integer greater than or equal to 2) crossing the data lines (D1 to Dm), a high potential voltage line VDDL supplied with a high potential voltage, a low potential voltage line VSSL supplied with a low potential voltage, and pixels PX connected to the data lines D1 to Dm and the scan lines S1 to Sn.

Each of the pixels PX may comprise a first sub-pixel PX1, a second sub-pixel PX2, and a third sub-pixel PX3. The first sub-pixel PX1 may emit a first color light with a first main wavelength, the second sub-pixel PX2 may emit of a second color light with a second main wavelength, and the third sub-pixel PX3 may emit a third color light with a third main wavelength. The first color light may be red light, the second color light may be green light, and the third color light may be blue light, but are not limited thereto. In addition, in FIG. 3, it is illustrated that each of the pixels PX comprise three sub-pixels, but are not limited thereto. That is, each of the pixels PX may comprise four or more sub-pixels.

Each of the first sub-pixel PX1, the second sub-pixel PX2, and the third sub-pixel PX3 may be connected to at least one of the data lines D1 to Dm, at least one of the scan lines S1 to Sn, and a high potential voltage line VDDL. As shown in FIG. 4, the first sub-pixel PX1 may include light emitting devices LDs, a plurality of transistors for supplying current to the light emitting devices LDs, and at least one capacitor.

Although not shown in the drawing, each of the first sub-pixel PX1, the second sub-pixel PX2, and the third sub-pixel PX3 may include only one light emitting device LD and at least one capacitor Cst.

Each of the light emitting devices LD may be a semiconductor light emitting diode including a first electrode, a plurality of conductive semiconductor layers, and a second electrode. Here, the first electrode may be an anode electrode, and the second electrode may be a cathode electrode, but is not limited thereto.

The light emitting device LD may be one of a lateral type light emitting device, a flip-chip type light emitting device, and a vertical type light emitting device.

The plurality of transistors may include a driving transistor DT supplying current to the light emitting devices LD and a scan transistor ST supplying a data voltage to a gate electrode of the driving transistor DT, as shown in FIG. 4. The driving transistor DT has a gate electrode connected to the source electrode of the scan transistor ST, a source electrode connected to the high potential voltage line VDDL to which a high potential voltage is applied, and a drain electrode connected to the first electrodes of the light emitting devices LD. The scan transistor ST has a gate electrode connected to the scan line (Sk, k is an integer that satisfies $1 \leq k \leq n$), a source electrode connected to the gate electrode of the driving transistor DT, and a drain electrode connected to the data lines (Dj, j an integer that satisfies $1 \leq j \leq m$).

The capacitor Cst is formed between the gate electrode and the source electrode of the driving transistor DT. The storage capacitor Cst stores a difference voltage between a gate voltage and a source voltage of the driving transistor DT.

The driving transistor DT and the scan transistor ST may be formed of a thin film transistor. In addition, in FIG. 4, the driving transistor DT and the scan transistor ST have been mainly described as being formed of P-type MOSFETs (Metal Oxide Semiconductor Field Effect Transistors), but are not limited thereto. The driving transistor DT and the scan transistor ST may be formed of N-type MOSFETs. In this case, positions of the source electrode and the drain electrode of each of the driving transistor DT and the scan transistor ST may be changed.

In addition, in FIG. 4, it is illustrated that each of the first sub-pixel PX1, the second sub-pixel PX2, and the third sub-pixel PX3 includes 2 T1C (2 Transistor-1 capacitor) having one driving transistor DT, one scan transistor ST, and one capacitor Cst, but is not limited thereto. Each of the first sub-pixel PX1, the second sub-pixel PX2, and the third sub-pixel PX3 may include a plurality of scan transistors ST and a plurality of capacitors Cst.

Since the second sub-pixel PX2 and the third sub-pixel PX3 may be expressed with substantially the same circuit diagram as the first sub-pixel PX1, detailed descriptions will be omitted.

The driving circuit 20 outputs signals and voltages for driving the display panel 10. To this end, the driving circuit 20 may include a data driving circuit 21 and a timing controller 22.

The data driving circuit 21 receives digital video data DATA and a source control signal DCS from the timing controller 22. The data driving circuit 21 converts the digital video data DATA into analog data voltages according to the source control signal DCS and supplies them to the data lines D1 to Dm of the display panel 10.

The timing controller 22 receives digital video data DATA and timing signals from a host system. The timing signals may include a vertical synchronization signal, a horizontal synchronization signal, a data enable signal, and a dot clock. The host system may be an application processor of a smart phone or tablet PC, a system on chip of a monitor or TV, and the like.

The timing controller 22 generates control signals for controlling operation timings of the data driving circuit 21 and the scan driving circuit 30. The control signals may include a source control signal DCS for controlling the operation timing of the data driving circuit 21 and a scan control signal SCS for controlling the operation timing of the scan driving circuit 30.

The driving circuit 20 may be disposed in the non-display area NDA provided on one side of the display panel 10. The driving circuit 20 may be formed of an integrated circuit (IC) and mounted on the display panel 10 using a chip on glass (COG) scheme, a chip on plastic (COP) scheme, or an ultrasonic bonding scheme, but is not limited thereto. For example, the driving circuit 20 may be mounted on a circuit board (not shown) instead of the display panel 10.

The data driving circuit 21 may be mounted on the display panel 10 using a chip on glass (COG) scheme, a chip on plastic (COP) scheme, or an ultrasonic bonding scheme, and the timing controller 22 may be mounted on a circuit board.

The scan driving circuit 30 receives the scan control signal SCS from the timing controller 22. The scan driving circuit 30 generates scan signals according to the scan control signal SCS and supplies them to the scan lines S1 to Sn of the display panel 10. The scan driving circuit 30 may include a plurality of transistors and be formed in the non-display area NDA of the display panel Alternatively, the scan driving circuit 30 may be formed as an integrated circuit, and in this case, it may be mounted on a gate flexible film attached to the other side of the display panel 10.

The circuit board may be attached to pads provided on one edge of the display panel 10 using an anisotropic conductive film. For this reason, the lead lines of the circuit board may be electrically connected to the pads. The circuit board may be a flexible printed circuit board, a printed circuit board, or a flexible film such as a chip on film. The circuit board may be bent under the display panel 10. Accordingly, one side of the circuit board may be attached to one edge of the display panel 10 and the other side may be disposed below the display panel 10 and connected to a system board on which a host system is mounted.

The power supply circuit 50 may generate voltages necessary for driving the display panel from the main power supplied from the system board and supply the voltages to the display panel 10. For example, the power supply circuit 50 generates a high potential voltage VDD and a low potential voltage VSS for driving the light emitting devices LD of the display panel 10 from the main power supply to supply them to the high potential voltage line VDDL and the low potential voltage line VSSL. Also, the power supply circuit 50 may generate and supply driving voltages for driving the driving circuit 20 and the scan driving circuit 30 from the main power.

Figure 5:
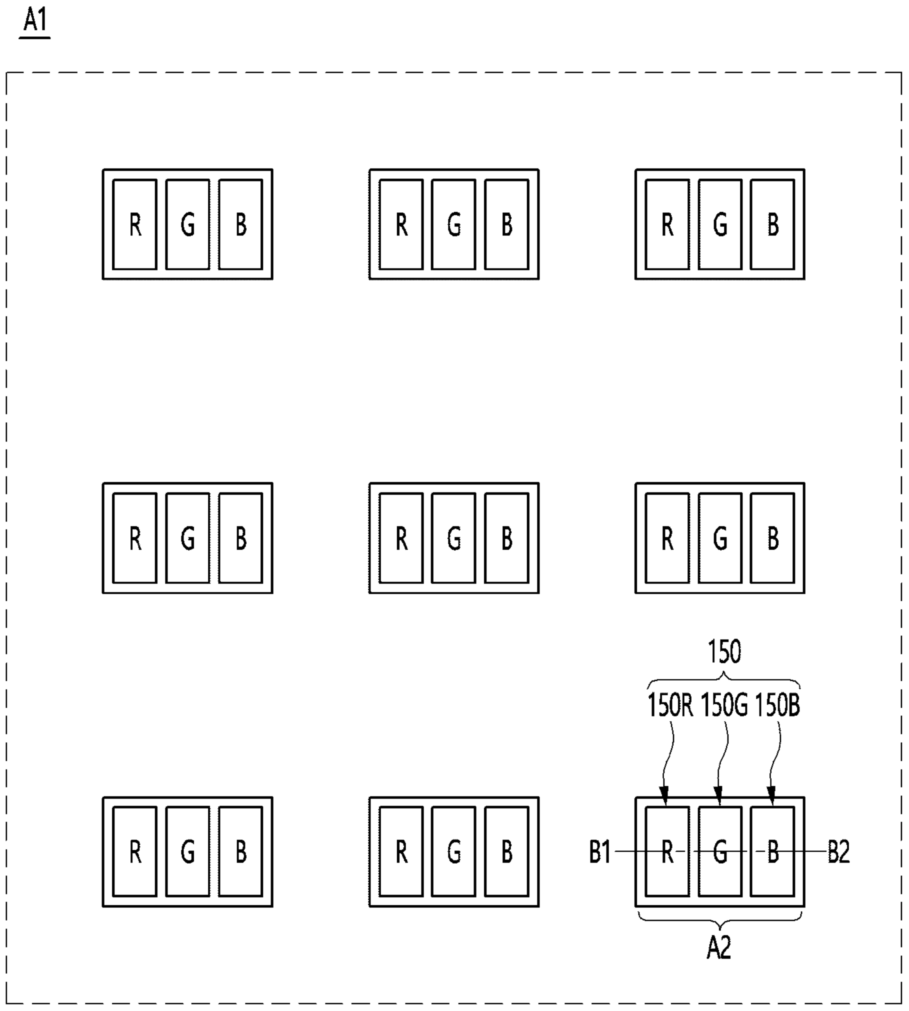
FIG. 5 is an enlarged view of a first panel region in the display device of FIG. 2.

FIG. 5 is an enlarged view of a first panel region in the display device of FIG. 2.

Referring to FIG. 5, a display device 100 of the embodiment may be manufactured by mechanically and electrically connecting a plurality of panel regions such as the first panel region A1 by tiling.

The first panel region A1 may include a plurality of light emitting devices 150 arranged for each unit pixel (PX in FIG. 3).

For example, the unit pixel PX may include a first sub-pixel PX1, a second sub-pixel PX2, and a third sub-pixel PX3. For example, a plurality of red light emitting devices 150R may be disposed on the first sub-pixel PX1, a plurality of green light emitting devices 150G may be disposed on the second sub-pixel PX2, and a plurality of blue light emitting devices 150B may be disposed on the third sub-pixel PX3. The unit pixel PX may further include a fourth sub-pixel in which no light emitting device is disposed, but is not limited thereto.

In the above, the descriptions have been limited to the display device for a TV, but the embodiment is not limited thereto. That is, the embodiment can be equally applied to a display device for AR or a display device for HUD.

Meanwhile, the embodiment includes a plurality of light resonance structures, respectively, capable of emitting light using a light resonance mode, thereby obtaining high definition/high resolution and improving luminance.

Descriptions omitted below can be readily understood from the descriptions given above with respect to FIGS. 5 to 10 and the corresponding drawings.

The First Embodiment

Figure 6:
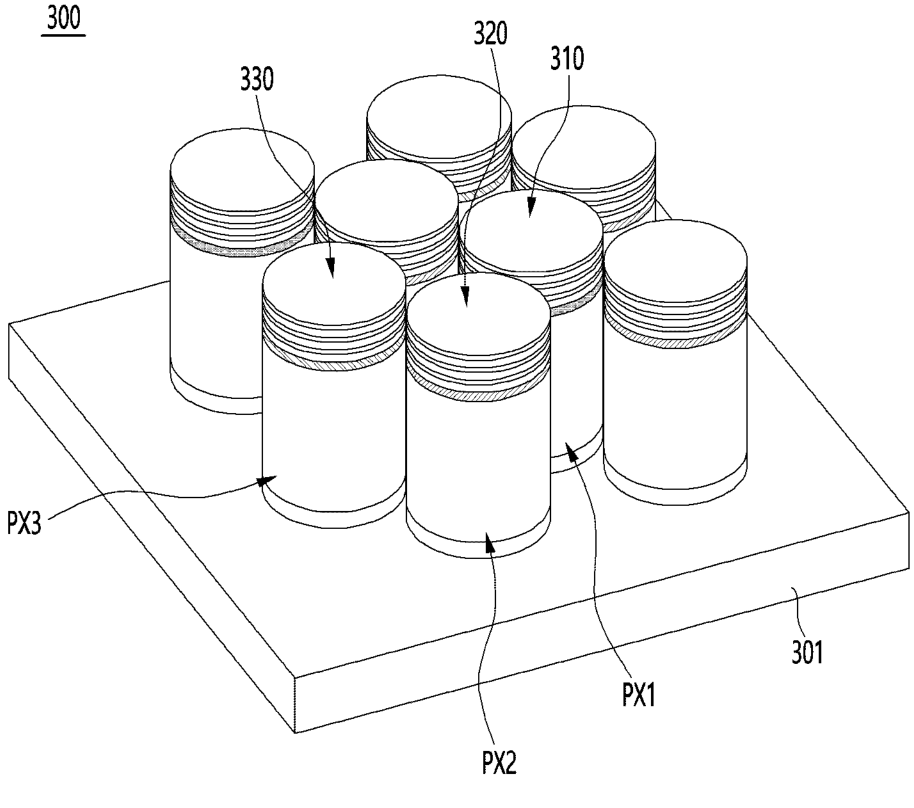
FIG. 6 is a perspective view illustrating a display device according to a first embodiment.
Figure 7:
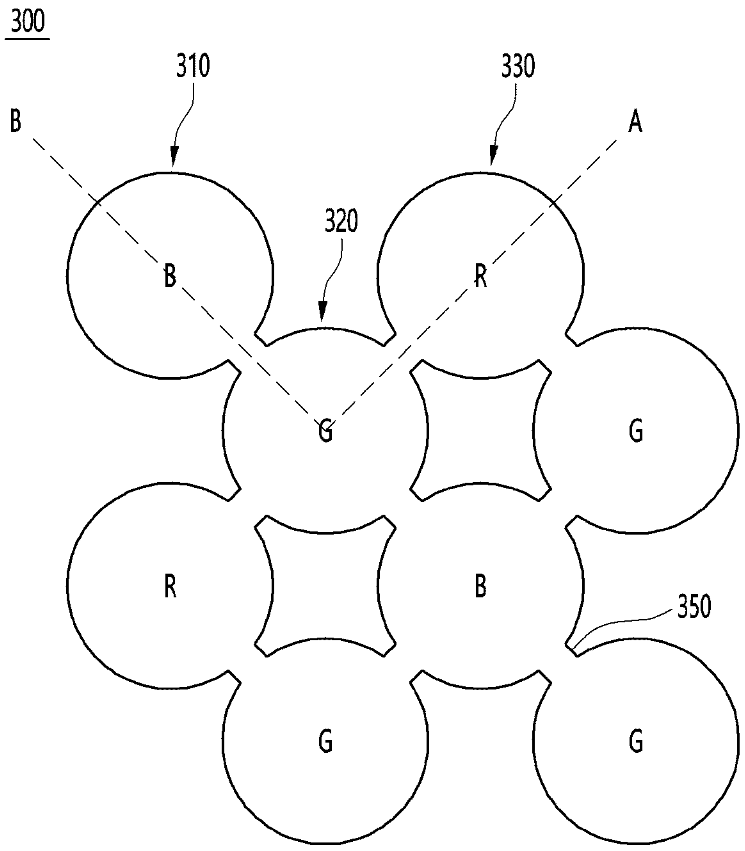
FIG. 7 is a plan view illustrating the display device according to the first embodiment.
Figure 8:
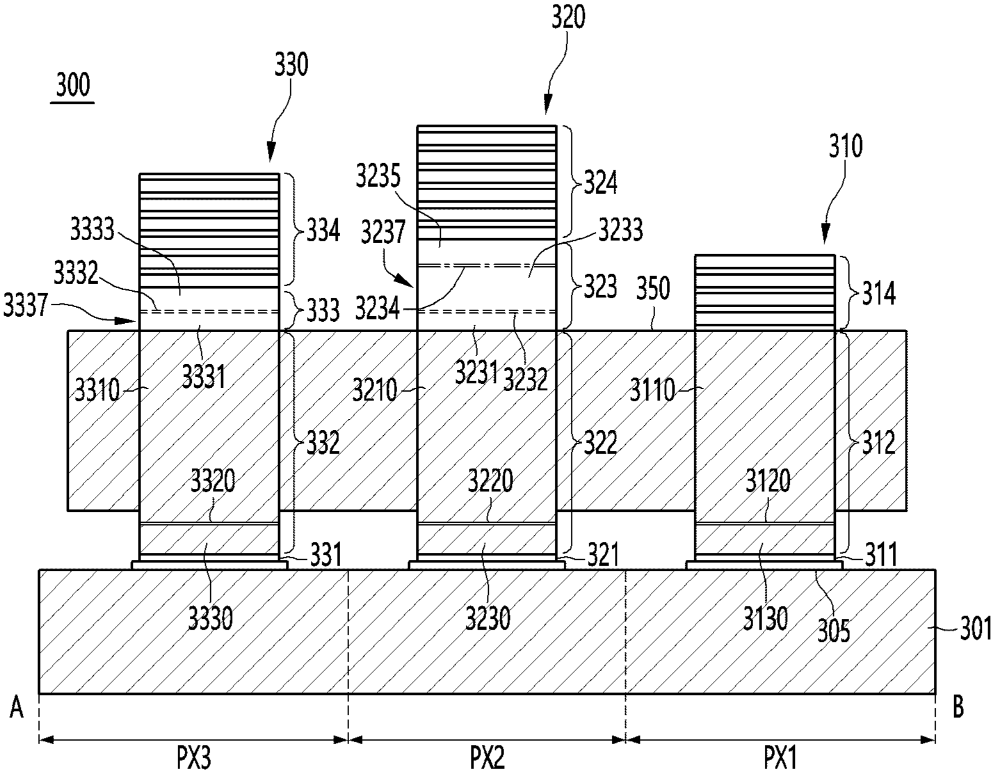
FIG. 8 is a cross-sectional view illustrating the display device according to the first embodiment.

FIG. 6 is a perspective view illustrating a display device according to a first embodiment. FIG. 7 is a plan view illustrating the display device according to the first embodiment. FIG. 8 is a cross-sectional view illustrating the display device according to the first embodiment.

Referring to FIGS. 6 to 8, a display device 300 according to the first embodiment may comprise a substrate 301 and a plurality of light resonance structures 310, 320, and 330.

The substrate 301 may include a plurality of sub-pixels PX1, PX2, and PX3 constituting a unit pixel. The plurality of sub-pixels may include, for example, the first sub-pixel PX1, the second sub-pixel PX2, and the third sub-pixel PX3, but are not limited thereto.

For example, the first sub-pixel PX1 may be an area emitting blue light, the second sub-pixel PX2 may be an area emitting green light, and the third sub-pixel PX3 may be an area emitting red light. Accordingly, a color image may be displayed by the unit pixel including the first sub-pixel PX1, the second sub-pixel PX2, and the third sub-pixel PX3. Since a plurality of pixels are defined on the substrate 301, a still image or a moving image can be displayed by the plurality of pixels on the substrate 301.

The substrate 301 may include a plurality of layers. The plurality of layers may include an insulating film made of an organic material or an inorganic material, a signal line made of metal, or the like. Thin film transistors, capacitors, gate lines, data lines, and the like can be configured by the plurality of layers. For example, the driving circuit 305 may be constituted by the thin film transistors, the capacitors, the gate lines, the data lines, and the like. For example, the driving circuit 305 may be provided in each of the first sub-pixel PX1, the second sub-pixel PX2, and the third sub-pixel PX3.

The plurality of light resonance structures may include a first light resonance structure 310, a second light resonance structure 320 and a third light resonance structure 330, but are not limited thereto. For example, the first light resonance structure 310 is disposed on the first sub-pixel PX1, the second light resonance structure 320 is disposed on the second sub-pixel PX2, and the third light resonance structure 330 may be disposed on the third sub-pixel PX3.

For example, each of the first light resonance structure 310, the second light resonance structure 320, and the third light resonance structure 330 may have a cylindrical shape, but is not limited thereto. For example, each of the first light resonance structure 310, the second light resonance structure 320, and the third light resonance structure 330 may have a circular shape when viewed from above, but is not limited thereto.

Figure 9:
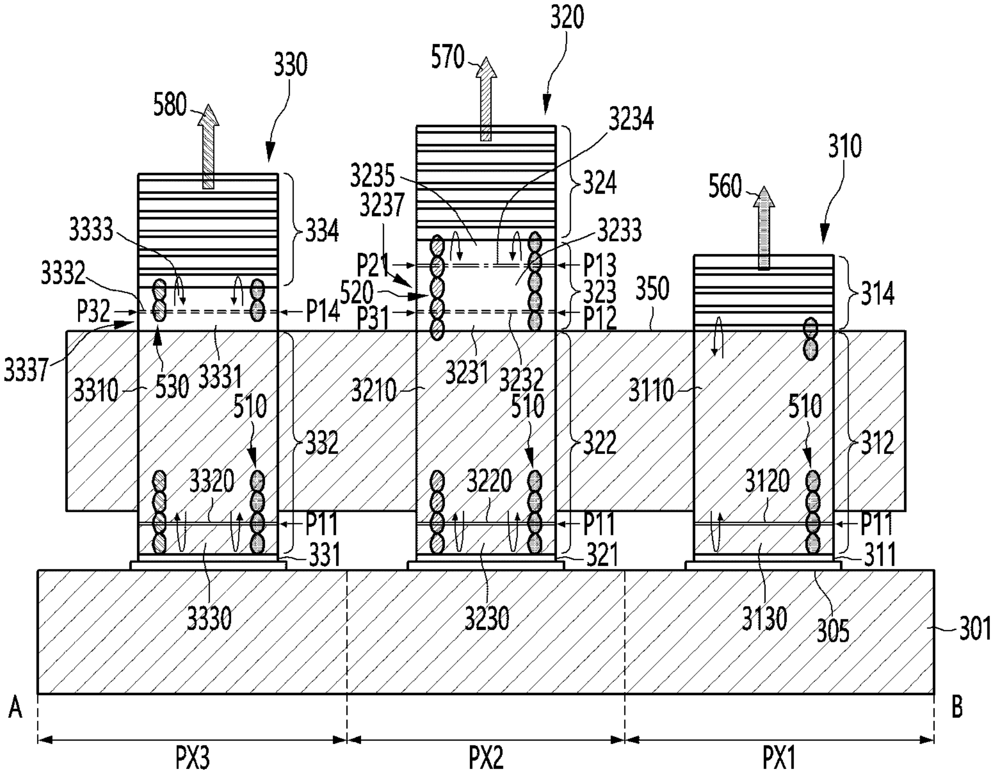
FIG. 9 shows an operating principle of the display device according to the first embodiment.

As shown in FIG. 9, the first light resonance structure 310 may emit a first light 560 by using a first light resonance mode 510. The second light resonance structure 320 may emit a second light 570 by using a second light resonance mode 520. The third light resonance structure 330 may emit a third light 580 by using a third light resonance mode 530. For example, the first light 560 may include blue light, and the second light 570 may include green light, and the third light 580 may include red light, but is not limited thereto.

The first light 560 may be emitted along a vertical direction by the first light resonance mode 510. The second light 570 may be emitted along a vertical direction by the second light resonance mode 520. The third light 580 may be emitted along the vertical direction by the third light resonance mode 530.

The first light 560 may be reflected from an upper side and a lower side the first light resonance structure 310 to form the first light resonance mode 510. Accordingly, the first light 560 may be resonated or amplified by the first light resonance mode 510. The second light 570 may be reflected from an upper side and a lower side of the second light resonance structure 320 to form the second light resonance mode 520. Accordingly, the second light 570 may be resonated or amplified by the second light resonance mode 520. The third light 580 may be reflected from an upper side and a lower side of the third light resonance structure 330 to form the second light resonance mode 520. Accordingly, the third light 580 may be resonated or amplified by the third light resonance mode 530.

The first light resonance structure 310, the second light resonance structure 320, and the third light resonance structure 330 may be spaced apart from each other. In this case, side portions of each of the first light resonance structure 310, the second light resonance structure 320, and the third light resonance structure 330 may be coated with total reflection layers 3237 and 3337. Accordingly, the first light 560 may be resonated or amplified by being totally reflected by the total reflection layers 3237 and 3337 of the first light resonance structure 310. The second light 570 may be resonated or amplified by total reflection in the total reflection layers 3237 and 3337 of the second light resonance structure 320. The third light 580 may be resonated or amplified by total reflection in the total reflection layers 3237 and 3337 of the third light resonance structure 330.

Meanwhile, each of the first light resonance structure 310, the second light resonance structure 320, and the third light resonance structure 330 may generate the first light 560 having the same wavelength. That is, each of the first light resonance structure 310, the second light resonance structure 320, and the third light resonance structure 330 may generate blue light.

The first light resonance structure 310 includes a first light generator 312, the second light resonance structure 320 includes a second light generator 313, and the third light resonance structure 330 includes a second light resonance structure 330. Each of the first light generator 312, the second light generator 322, and/or the third light generator 332 may include a semiconductor light emitting device. For example, the semiconductor light emitting device may be formed of a Group II-VI compound semiconductor material or a Group III-V compound semiconductor material. The semiconductor light emitting device may include a plurality of semiconductor layers. Among the plurality of semiconductor layers, some semiconductor layers may include a first conductivity type dopant or a second conductivity type dopant. For example, the first conductivity type dopant may include phosphorus (P) or the like, and the second conductivity type dopant may include boron (B) or the like.

Each of the first light generator 312, the second light generator 322, and the third light generator 332 may include the first conductivity type semiconductor layer 3110, 3210, and 3310, the active layer 3120, 3220, and 3320, and the second conductive semiconductor layer 3130, 3230, and 3330. For example, the second conductivity type semiconductor layers 3130, 3230, and 3330 may be disposed on the substrate 301, and the active layers 3120, 3220, and 3320 may be disposed on the second conductivity type semiconductor layers 3130, 3230, and 3330, and the first conductivity type semiconductor layers 3110, 3210, and 3310 may be disposed on the active layers 3120, 3220, and 3320. For example, the first conductivity type semiconductor layers 3110, 3210, and 3310 may include a first conductivity type dopant, and the second conductivity type semiconductor layers 3130, 3230 and 3330 may include a second conductivity type dopant, but are not limited thereto.

For example, the second conductivity type semiconductor layer 3130 of the first light generator 312 may be disposed on a 1-1 reflective layer 311, and the second conductivity type semiconductor layer 3230 of the second light generator 322 may be disposed on a 2-1 reflective layer 321, and the second conductivity type semiconductor layer 3330 of the third light generator 332 may be disposed on a 3-1 reflective layer 331. When the second conductivity type semiconductor layer 3130, 3230, and 3330 includes the second conductivity type dopant, hole generation is not easy. Thus, an ohmic layer may be disposed on the 1-1 reflective layer 311, the 2-1 reflective layer 321 and/or the 3-1 reflective layer 331. For example, since an adhesive layer or a bonding layer is disposed under the 1-1 reflective layer 311, the 2-1 reflective layer 321 and/or the 3-1 reflective layer 331, the 1-1 reflective layer 311, the 2-1 reflective layer 321 and/or the 3-1 reflective layer 331 may be easily attached to the substrate 301 or the driving circuit 305.

The first light resonance structure 310 may emit the first light 560 generated by the first light generator 312 as it is.

The first light resonance structure 310 may amplify and emit the first light 560. To this end, the first light resonance structure 310 may include the 1-1 reflective layer 311 and a 1-2 reflective layer 314. The 1-1 reflective layer 311 may be disposed on the substrate 301, and the 1-2 reflective layer 314 may be disposed on the 1-1 reflective layer 311. The 1-1 reflective layer 311 and the 1-2 reflective layer 314 may constitute a first light resonance mode generator.

The 1-1 reflective layer 311 may be made of a metal having a high reflectance. For example, the 1-1 reflective layer 311 may include aluminum (Al), an aluminum alloy, platinum (Pt), a platinum alloy, or the like.

The 1-2 reflective layers 314 may selectively transmit/reflect light. For example, the 1-1 reflective layer 311 may transmit part of the first light 560 and reflect another part of the first light 560. For example, the 1-2 reflective layers 314 may have a diffracted Bragg's reflector (DBR) structure. For example, the 1-2 reflective layers 314 may have a DBR structure in which high refractive medium layers and low refractive medium layers are alternately stacked. For example, the DBR structure may be formed by alternately stacking $SiO_2/TiO_2$, but is not limited thereto.

The first light generator 312 may be disposed between the 1-1 reflective layer 311 and the 1-2 reflective layer 314. In this case, as shown in FIG. 9, since the first light 560 generated by the first light generator 312 is reflected by the 1-1 reflective layer 311 and the 1-2 reflective layer 314, a first light resonance mode 510 may be formed between the 1-1 reflective layer 311 and the 1-2 reflective layer 314. In this case, an anti-node of the first light resonance mode 510 may be located in an active layer 3120 of the first light generator 312.

Therefore, since the energy of the first light 560 having the first light resonance mode 510 is maximally transferred to the active layer 3120 of the first light generator 312, the amount of light of the first light 560 can be further increased. The anti-node may mean a position where the amplitude of the first light 560 having the first light resonance mode 510 is maximum. In contrast, a node may mean a position where the amplitude of the first light 560 having the first light resonance mode 510 is minimum, for example, 0. Since the amount of light of the first light 560 further increased in this way is emitted, light efficiency may be improved and luminance may be increased.

The second light resonance structure 320 may amplify the first light 560 generated by the second light generator 322. To this end, the second light resonance structure may include a 2-1 reflective layer 321 and a 2-2 reflective layer 324. The 2-1 reflective layer 321 may be disposed on the substrate 301, and the 2-2 reflective layer 324 may be disposed on the 2-1 reflective layer 321. The 2-1 reflective layer 321 and the 2-2 reflective layer 324 may constitute a second light resonance mode generator.

The 2-1 reflective layer 321 may be made of a metal having a high reflectance. For example, the 2-1 reflective layer 321 may include aluminum (Al), an aluminum alloy, platinum (Pt), a platinum alloy, or the like.

The 2-2 reflective layer 324 may selectively transmit/reflect light. For example, the 2-2 reflective layer 324 may totally reflect the first light 560 and partially transmit/reflect the second light 570. For example, a part of the second light 570 may be transmitted and another part of the second light 570 may be reflected. For example, the 2-2 reflective layer 324 may have a DBR structure. For example, the 2-2 reflective layer 324 may have a DBR structure in which high refractive medium layers and low refractive medium layers are alternately stacked. For example, the DBR structure may be formed by alternately stacking $SiO_2/TiO_2$, but is not limited thereto.

The second light generator 322 may be disposed between the 2-1 reflective layer 321 and the 2-2 reflective layer 324. In this case, as shown in FIG. 9, since the first light 560 generated by the second light generator 322 is reflected by the 2-1 reflective layer 321 and the 2-2 reflective layer 324, a first light resonance mode 510 may be formed between the 2-1 reflective layer 321 and the 2-2 reflective layer 324. In this case, an anti-node of the first light resonance mode 510 may be located in an active layer 3220 of the second light generator. Therefore, the energy of the first light 560 having the first light resonance mode 510 is maximally transferred to the active layer 3220 of the second light generator 322, and the amount of light of the first light 560 can be further increased.

The third light resonance structure 330 may amplify the first light 560 generated by the third light generator 332. To this end, the third light resonance structure 330 may include a 3-1 reflective layer 331 and a 3-2 reflective layer 334. The 3-1 reflective layer 331 may be disposed on the substrate 301, and the 3-2 reflective layer 334 may be disposed on the 3-1 reflective layer 331. The 3-1 reflective layer 331 and the 3-2 reflective layer 334 may constitute a third light resonance mode generator.

The 3-1 reflective layer 331 may be made of a metal having a high reflectance. For example, the 3-1 reflective layer 331 may include aluminum (Al), an aluminum alloy, platinum (Pt), a platinum alloy, or the like.

The 3-2 reflective layer 334 may selectively transmit/reflect light. For example, the 3-2 reflective layer 334 may totally reflect the first light 560 and partially transmit/reflect the third light 580. For example, a part of the third light 580 may be transmitted and another part of the third light 580 may be reflected. For example, the 3-2 reflective layer 334 may have a DBR structure. For example, the 3-2 reflective layer 334 may have a DBR structure in which high refractive medium layers and low refractive medium layers are alternately stacked. For example, the DBR structure may be formed by alternately stacking $SiO_2/TiO_2$, but is not limited thereto.

The third light generator 332 may be disposed between the 3-1 reflective layer 331 and the 3-2 reflective layer 334. In this case, as shown in FIG. 9, since the first light 560 generated by the third light generator 332 is reflected by the 3-1 reflective layer 331 and the 3-2 reflective layer 334, a first light resonance mode 510 may be formed between the 3-1 reflective layer 331 and the 3-2 reflective layer 334. In this case, an anti-node of the first light resonance mode 510 may be located in an active layer 3320 of the third light generator 332. Therefore, the maximum energy of the first light 560 having the first light resonance mode 510 is maximally transferred to the active layer 3320 of the third light generator 332, and the amount of light of the first light 560 is further increased. can be increased.

Meanwhile, the second light resonance structure 320 may convert the first light 560 generated by the second light generator 322 into the second light 570 and then emit the second light 570. To this end, the second light resonance structure 320 may include a first color converter 323. For example, the first color converter 323 may include quantum dots or phosphors. The first color converter 323 may be disposed on the second light generator 322 to convert the first light 560 generated by the second light generator 322 into the second light 570. The first color converter 323 may be disposed between the second light generator 322 and the 2-2 reflective layer 324.

The first color converter 323 may include a plurality of insulation layers 3231, 3233, and 3235 and color conversion layers 3232 and 3234. For example, the first color converter 323 may include first to third insulation layers 3231, 3233, and 3235, a 1-1 color conversion layer 3234, and a 1-2 color conversion layer 3232. The first insulation layer 3231 may be disposed on the first light generator 312, and the 1-2 color conversion layer 3232 may be disposed on the first insulation layer 3231. The second insulation layer 3233 is disposed on the 1-2 color conversion layer 3232, the 1-1 color conversion layer 3234 is disposed on the second insulation layer 3233, and the third insulation layer 3235 may be disposed on the 1-1 color conversion layer 3234.

For example, the 1-1 color conversion layer 3234 may be disposed between the second light generator 322 and the 2-2 reflective layer 324 to convert the first light 560 generated by the second light generator 322 into second light 570. For example, the 1-1 color conversion layer 3234 may be disposed between the 2-1 reflective layer 321 and the 2-2 reflective layer 324, and the second light 570 of the 1-1 color conversion layer 3234 may be formed as the second light resonance mode 520.

For example, the 1-2 color conversion layer 3232 may be disposed between the active layer 3220 of the second light generator 322 and the 1-1 color conversion layer 3234, and convert the first light 560 generated by the second light generator 322 into the third light 580. For example, the 1-2 color conversion layer 3232 may be disposed between the 2-1 reflective layer 321 and the 2-2 reflective layer 324.

For example, the first to third insulation layers 3231, 3233, and 3235 may be made of an organic material or an inorganic material.

For example, the 1-1 color conversion layer 3234 may include a color conversion material capable of converting the first light 560 into the second light 570, such as quantum dots or phosphors. For example, the 1-2 color conversion layer 3232 may include a color conversion material capable of converting the first light 560 into the second light 570, such as quantum dots or phosphors.

Although not shown, the second insulation layer 3233 disposed between the 1-1 color conversion layer 3234 and the 1-2 color conversion layer 3232 is omitted such that the 1-1 color conversion layer 3234 and the 1-2 color conversion layer 3232 may contact each other.

For example, the anti-node of the first light resonance mode 510 may be located in the 1-1 color conversion layer 3234. In this case, as shown in FIG. 9, since the 1-1 color conversion layer 3234 maximally absorbs the energy of the first light 560 having the first light resonance mode 510, the conversion efficiency of the color conversion layer 3234 may be remarkably increased. Accordingly, the mount of light of the second light 570 converted by the 1-1 color conversion layer 3234 may be further increased.

For example, a node of the first light resonance mode 510 may be located in the 1-2 color conversion layer 3232. In this case, since the energy of the first light 560 having the first light resonance mode 510 is minimally transferred or not transferred at all to the 1-1 color conversion layer 3234, the 1-2 color conversion layer 3232 can be minimal or zero. Accordingly, the third light 580 converted by the 1-2 color conversion layer 3232 may be insignificant or non-existent.

Accordingly, the first color converter 323 may emit only the second light 570 without emitting the third light 580.

In addition, since the anti-node of the first light resonance mode 510 is located in the 1-1 color conversion layer 3234, the energy of the first light 560 having the first light resonance mode 510 is maximally absorbed by the 1-1 color conversion layer 3234. Thus, all of the first light can be used for conversion into the second light 570. Therefore, since the first light 560 generated by the second light generator 322 does not pass through the first color converter 323 and only the second light 570 is emitted, color mixing defects between the first light 560 and the second light 570 may can be prevented.

Meanwhile, since the second light 570 converted by the 1-1 color conversion layer 3234 is reflected by the 1-1 reflective layer 311 and the 1-2 reflective layer 314, the second light resonance mode. 520 may be formed between the 1-1 reflective layer 311 and the 1-2 reflective layer 314. As shown in FIG. 9, the anti-node of the second light resonance mode 520 may be located in the 1-1 color conversion layer 3234. In this case, the 1-1 color conversion layer 3234 can maximally absorb the energy of the second light 570, thereby further increasing the amount of light of the second light 570.

Thus, the 1-1 color conversion layer 3234 may be a position of the anti-node of the second light resonance mode 520 as well as a position of the anti-node of the first light resonance mode 510. Accordingly, the 1-1 color conversion layer 3234 may maximally receive the energy of the first light 560 having the first light resonance mode 510 and maximally absorb the energy of the first light 560. Therefore, since all of the first light 560 is converted into the second light 570, the amount of light of the second light 570 may be significantly increased. Since the first light 560 is not emitted to the outside through the first color converter 323, color mixing defects between the first light 560 and the second light 570 can be prevented.

In addition, the first light 560 may propagate in a vertical direction by the first light resonance mode 510 and the second light 570 may propagate in a vertical direction by the second light resonance mode 520. Therefore, since the first light 560 and the second light 570 are not emitted in the lateral direction through the side portion of the second light resonance structure 320, color mixing defects between the sub-pixels can be prevented. Light loss caused by being emitted in the lateral direction through the side portion of the second light resonance structure 320 can be prevented.

Meanwhile, the third light resonance structure 330 may convert the first light 560 generated by the third light generator 332 into the third light 580 and then emit the third light 580. To this end, the third light resonance structure 330 may include a second color converter 333. For example, the second color converter 333 may include quantum dots or phosphors. The second color converter 333 may be disposed on the third light generator 332 to convert the first light 560 generated by the third light generator 332 into the third light 580. The second color converter 333 may be disposed between the third light generator 332 and the 3-2 reflective layer 334.

The second color converter 333 may include a plurality of insulation layers 3331 and 3333, and at least one color conversion layer 3332. For example, the second color converter 333 may include a first insulation layer 3331, a second color conversion layer 3332, and a second insulation layer 3333. The first insulation layer 3331 may be disposed on the second light generator 322, and the second color conversion layer 3332 may be disposed on the first insulation layer 3331. The second insulation layer 3333 may be disposed on the second color conversion layer 3332.

For example, the second color conversion layer 3332 may be disposed between the third light generator 332 and the 3-2 reflective layer 334 to convert the first light 560 generated by the third light generator 332 into the third light 580. For example, the second color conversion layer 3332 is disposed between the 3-1 reflective layer 331 and the 3-2 reflective layer 334 to such that third light 580 of the second color conversion layer 3332 may be formed as the third light resonance mode 530.

For example, the first insulation layer 3331 and the second insulation layer 3333 may be made of an organic material or an inorganic material.

For example, the second color conversion layer 3332 may include a color conversion material capable of converting the first light 560 into the third light 580, such as quantum dots or phosphors.

For example, as shown in FIG. 9, the anti-node of the first light resonance mode 510 may be located in the second color conversion layer 3332. In this case, since the energy of the first light 560 having the first light resonance mode 510 is maximumly transferred to the second color conversion layer 3332, the conversion efficiency of the second color conversion layer 3332 may be significantly increased. Accordingly, the amount of light of the third light 580 converted by the second color conversion layer 3332 may be further increased.

The anti-node of the first light resonance mode 510 is located in the second color conversion layer 3332. Thus, since the energy of the first light 560 having the first light resonance mode 510 is maximally transferred to the second color conversion layer 3332, all of the first light 560 can be used for conversion to the third light 580. Therefore, since the first light 560 generated by the third light generator 332 does not pass through the second color converter 333 and only the third light 580 is emitted, color mixing defects between the first light 560 and second light 570 can be prevented.

Meanwhile, since the third light 580 converted by the second color conversion layer 3332 is reflected by the 3-1 reflective layer 331 and the 3-2 reflective layer 334, the third light resonance mode 530 may be formed between the 3-1 reflective layer 331 and the 3-2 reflective layer 334.

The anti-node of the third light resonance mode 530 may be located in the second color conversion layer 3332. In this case, the second color conversion layer 3332 can maximally absorb the energy of the first light 560 such that the amount of light of the third light 580 can be further increased.

Accordingly, the second color conversion layer 3332 may be a position of the anti-node of the third light resonance mode 530 as well as a position of the anti-node of the first light resonance mode 510. Accordingly, the second color conversion layer 3332 can maximally receive the energy of the first light 560 having the first light resonance mode 510 and maximally absorb the energy of the first light 560. Therefore, since all of the first light 560 is converted into the third light 580, the amount of light of the third light 580 can be significantly increased. Since the first light 560 passes through the second color converter 333. Since the first light 560 is not emitted to the outside through the second color converter 333, color mixing defects between the first light 560 and the third light 580 can be prevented.

In addition, the first light 560 may propagate in a vertical direction by the first light resonance mode 510 and the third light 580 may propagate in a vertical direction by the third light resonance mode 530. Accordingly, since the first light 560 and the third light 580 are not emitted in the lateral direction through the side portion of the third light resonance structure 330, color mixing defects between sub-pixels can be prevented. Light loss caused by being emitted in the lateral direction through the side portion of the third light resonance structure 330 can be prevented.

According to the first embodiment, the first light resonance structure 310, the second light resonance structure 320 and the third light resonance structure 330 may be spaced apart from each other in space. In addition, total reflection layers 3237 and 3337 may be coated on sidewalls of the first light resonance structure 310, the second light resonance structure 320, and the third light resonance structure 330, respectively. Accordingly, the first light 560, the second light 570, and the third light 580 may not be emitted in the horizontal direction through side portions of the first light resonance structure 310, the second light resonance structure 320, and the third light resonance structure 330, respectively. Therefore, since there is no need to form a separate barrier rib, the structure is simple and it is possible to implement a high-resolution and high-definition display.

Meanwhile, the 1-2 color conversion layer 3232 of the first color converter 323 and the second color conversion layer 3332 of the second color converter 333 may be disposed on the same layer. This is because the color conversion material and the quantum dot phosphor for forming the 1-2 color conversion layer 3232 and the second color conversion layer 3332 on the substrate 301 are deposited on the same layer of the substrate 301. Although not shown, the 1-2 color conversion layer 3232 of the first color converter 323 may be omitted.

Meanwhile, the display device 300 according to the first embodiment may include a connection part 350.

The connection part 350 may be commonly connected to the first light generator 312, the second light generator 322, and the third light generator 332. For example, the connection part 350 may be commonly connected to the first conductivity type semiconductor layers 3110, 3210, and 3310 of the first light generator 312, the second light generator 322, and the third light generator 332, respectively. In this case, the first conductivity type semiconductor layers 3110, 3210, and 3310 may be cathode electrodes, and the 1-1 reflective layer 311 of the first light generator 312, the 2-1 reflective layer 321 of the second light generator 322, and the 3-1 reflective layer 331 of the third light generator 332 may be an anode electrode. Although not shown, the 1-1 reflective layer 311, the 2-1 reflective layer 321 and the 3-1 reflective layer 331 may be commonly connected, but are not limited thereto. A voltage (or current) is supplied between the anode electrode and the cathode electrode such that the first light 560 is generated from each of the first light generator 312, the second light generator 322, and the third light generator 332.

As another example, the connection part 350 may an anode electrode and may be commonly connected to the second conductivity type semiconductor layers 3130, 3230, and 3330 of the first light generator 312, the second light generator 322, and the third light generator 332, respectively. Alternatively, the connection part 350 may be an anode electrode, and may be commonly connected to the 1-1 reflective layer 311 of the first light generator 312, the 2-1 reflective layer 321 of the second light generator 322, and the 3-1 reflective layer 331 of the third light generator 332. In this case, each of the first conductivity type semiconductor layers 3110, 3210, and 3310 of the first light generator 312, the second light generator 322, and the third light generator 332 may be a cathode electrode.

Figure 10A:
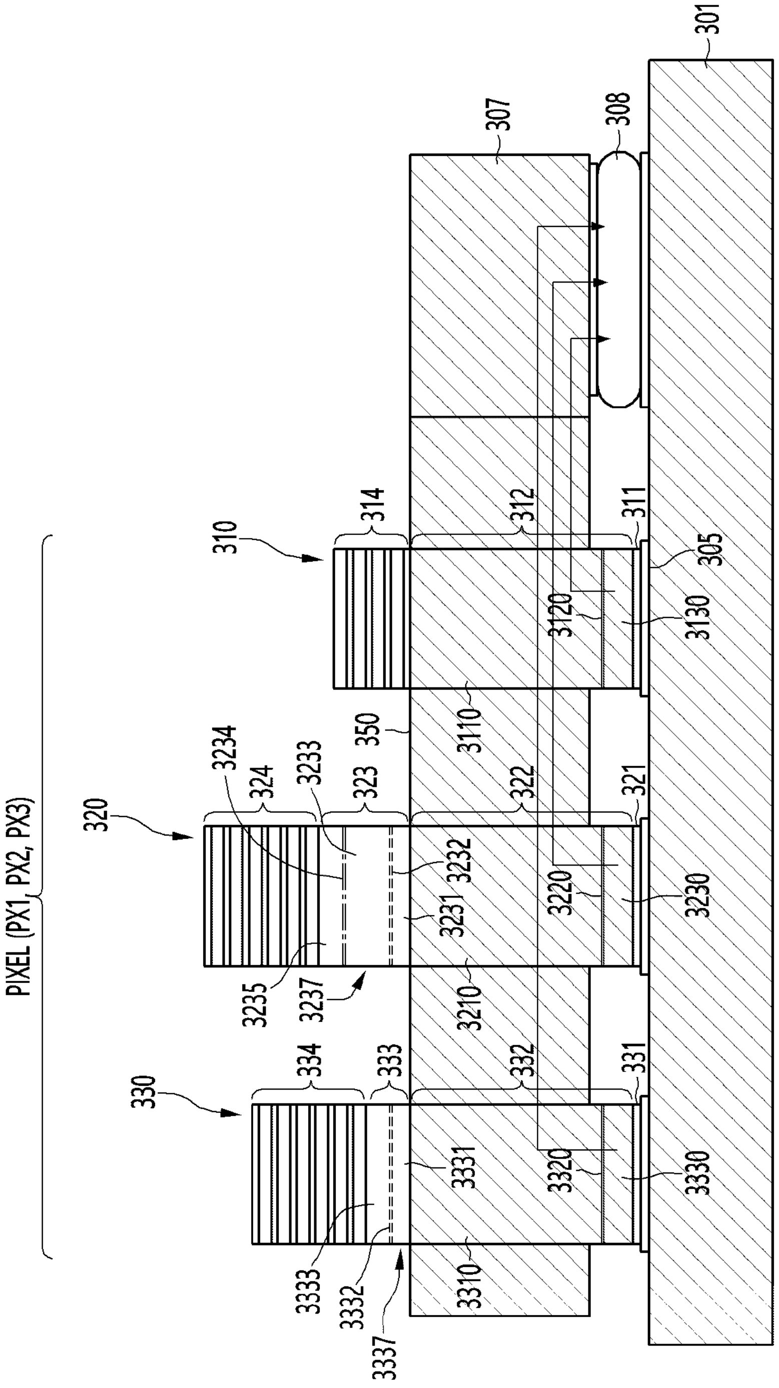
FIG. 10A is a cross-sectional view illustrating light generation of each of the first light generator, the second light generator, and the third light generator of FIG. 8.
Figure 10B:
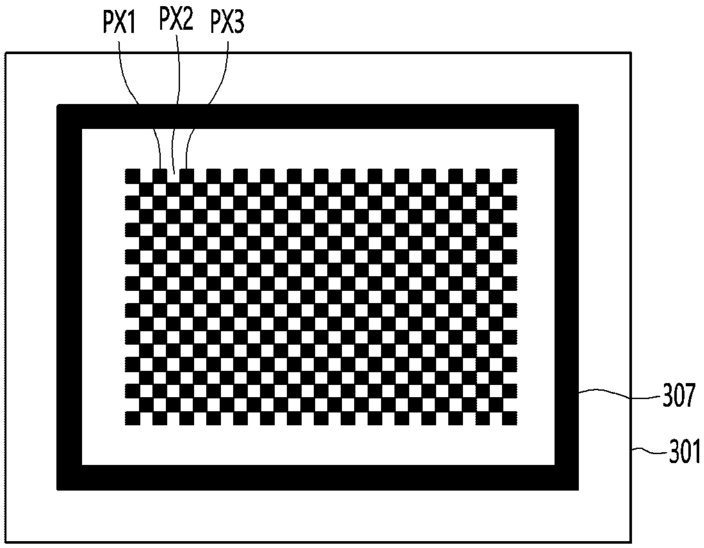
FIG. 10B is a plan view illustrating a common electrode pad commonly connected to each of the first light generator, the second light generator, and the third light generator of FIG. 8.

As shown in FIGS. 10A and 10B, a common electrode pad 307 may be disposed along the circumference of the substrate 301. In this case, the connection part 350 commonly connecting the first light generator 312, the second light generator 322, and the third light generator 332 may be electrically connected to the common electrode pad 307. The common electrode pad 307 may be electrically connected to the substrate 301 by using a bonding pad 308. Accordingly, an electric current flow is formed between each of the 1-1 reflection layer 311 of the first light generator 312, the 2-1 reflection layer 321 of the second light generator 322, and the 3-1 reflection layer 331 of the third light generator 332 and the common electrode pad 307, and the first light 560 may be generated from each of the first light generator 312, the second light generator 322, and the third light generator 332 by this current. In this case, the first light 560 generated by the first light generator 312 in the first light resonance structure 310 is amplified by the first light resonance mode 510 such that the first light 560 having an increased amount of light may be emitted. In the second light resonance structure 320, the first light 560 generated by the second light generator 322 may be converted into the second light 570 by the first color converter 323. At this time, the anti-node of the first light resonance mode 510 and the anti-node of the second light resonance mode 520 are located in the 1-1 color conversion layer 3234 of the first color converter 323 such that the second light 570 with a significantly increased amount of light may be emitted. In the third light resonance structure 330, the first light 560 generated by the third light generator 332 may be converted into third light 580 by the second color converter 333. At this time, the anti-node of the first light resonance mode 510 and the anti-node of the third light resonance mode 530 are located in the second color conversion layer of the second color converter 333 such that the third light 580 having a significantly increased amount of light may be emitted.

FIG. 11 to FIG. 16 show a manufacturing method of the display device according to the first embodiment.

Figure 11:
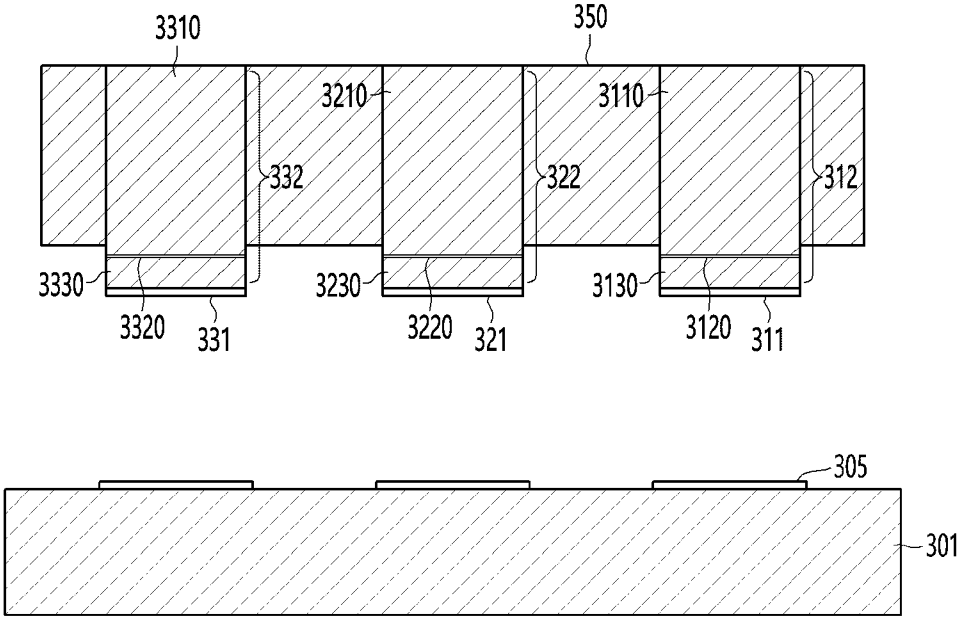
FIG. 11 to FIG. 16 show a manufacturing method of the display device according to the first embodiment.

As shown in FIG. 11, a substrate 301 may be provided. The substrate may comprise a driving circuit 305. The driving circuit 305 is disposed in each of the first sub-pixel PX1, the second sub-pixel PX2, and the third sub-pixel PX3. The first sub-pixel PX1, the second sub-pixel PX2, and the third sub-pixel PX3 may constitute each of a plurality of pixels.

A first light generator 312, a second light generator 322, and a third light generator 332 may be provided. The first light generator 312, the second light generator 322, and the third light generator 332 may be commonly connected by the connection part 350. At this time, a 1-1 reflective layer 311 may be disposed on the first light generator 312, a 2-1 reflective layer 321 may be disposed on the second light generator 322, and a 3-1 reflective layer 331 may be disposed on the third light generator 332.

For example, the first light generator 312, the second light generator 322, and the third light generator 332 may be formed on a wafer (or substrate). Specifically, first conductivity type semiconductor layers 3110, 3210, and 3310, active layers 3120, 3220, and 3320, and second conductivity type semiconductor layers 3130, 3230, and 3330 may be grown on a wafer using a deposition process. A metal film is formed on the second conductivity type semiconductor layers 3130, 3230, and 3330, and the 1-1 reflective layer 311, the 2-1 reflective layer 321, and the 3-1 reflective layer 331 may be formed using a photolithography process. Thereafter, the second conductive semiconductor layers 3130, 3230, and 3330 and the active layers 3120, 3220, and 3320 may be removed using an etching process. In this case, the first conductivity type semiconductor layers 3110, 3210, and 3310 corresponding to portions of the first conductivity type semiconductor layers 3110, 3210, and 3310 from which the second conductivity type semiconductor layers 3130, 3230, and 3330 and the active layers 3120, 3220, and 3320 are removed. The layers 3110, 3210, and 3310 may become the connecting part 350. Thereafter, the first light generator 312, the second light generator 322, and the third light generator 332 may be formed by separating the wafer using a laser lift-off (LLO) process. Other processes may be used instead of the LLO process.

Figure 12:
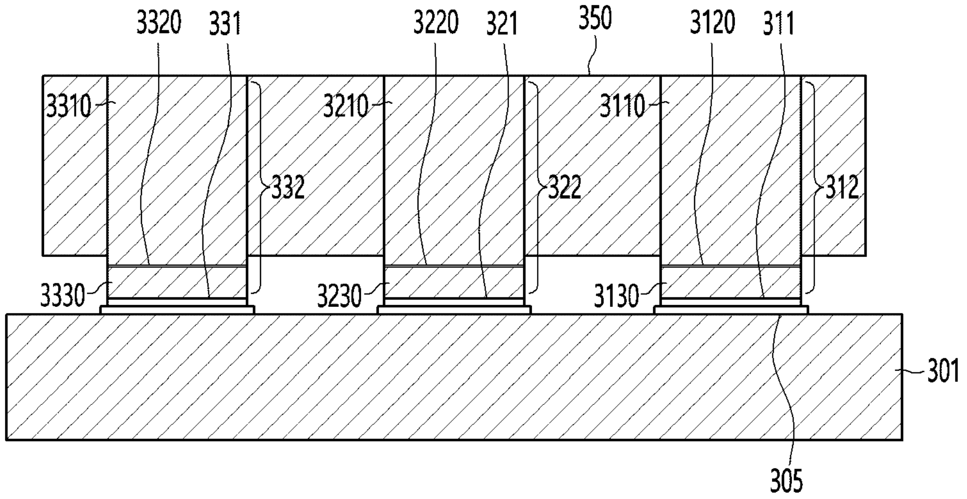

As shown in FIG. 12, the 1-1 reflection layer 311 of the first light generator 312, the 2-1 reflection layer 321 of the second light generator 322, and the 3-1 reflective layer 331 of the third light generator 332 may be disposed to face the substrate 301. Then, each of the 1-1 reflective layer 311, the 2-1 reflective layer 321, and the 3-1 reflective layer 331 may be electrically connected to the driving circuit 305. For example, each of the 1-1 reflective layer, the 2-1 reflective layer 321 and the 3-1 reflective layer 331 may be electrically connected to the driving circuit 305 using a bonding process, but is not limited thereto. Accordingly, the first light generator 312 may be disposed on the first sub-pixel PX1, the second light generator 322 may be disposed on the second sub-pixel PX2, and the third light generator 332 may be disposed on the third sub-pixel PX3.

The first to third light generators 312, 322, and 332 may generate the same color light, that is, a first light 560. For example, the first light 560 may include blue light, but is not limited thereto.

As in the related art, when the first light generator, the second light generator, and the third light generator are in the form of parts or packages, each of the first light generator, the second light generator, and the third light generator is positioned on the substrate, an alignment process must be performed so that each of the first light generator, the second light generator, and the third light generator is in an accurate position.

However, according to the first embodiment, the first light generator 312, the second light generator 322, and the third light generator 332 commonly connected by the connection part 350 are electrically attached to the substrate 301 as they are. Thus, the manufacturing process is easy and the process is simple. That is, since the first light generator 312, the second light generator 322, and the third light generator 332 are commonly connected using the connection part 350, it is possible to apply a uniform pressure to each of the first generator 312, the second generator 322 and the third light generator 332. Thus, light emission failure due to poor bonding can be prevented. In addition, since the first light generator 312, the second light generator 322, and the third light generator 332 are commonly connected using the connection part 350, a separate alignment process is not required and alignment defects can be prevented.

Figure 13:
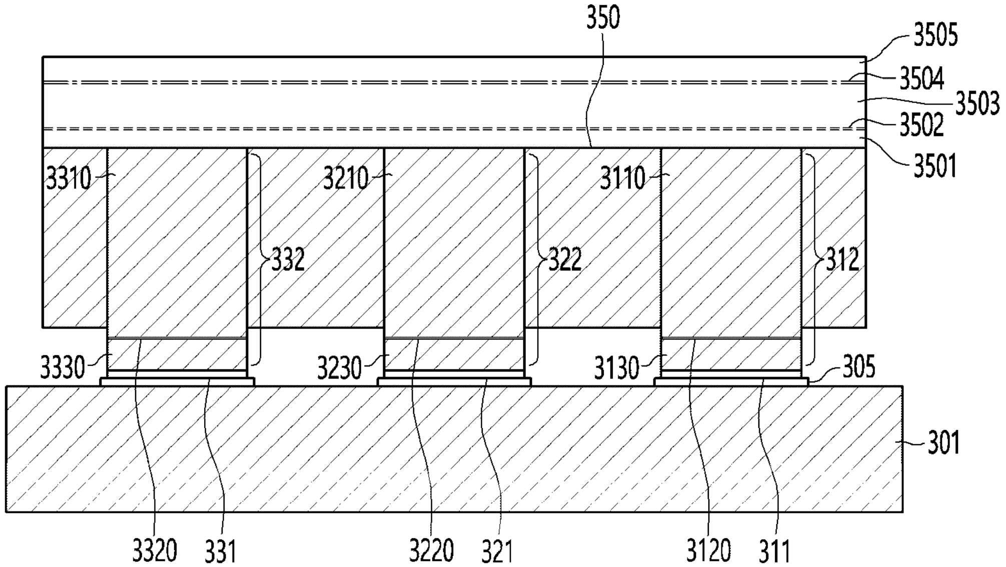

Meanwhile, as shown in FIG. 13, a plurality of insulating films 3501, 3503, and 3505 and a plurality of color conversion films 3502 and 3504 for forming a first color converter 323 and a second color converter 333 may be formed on the first light generator 312, the second light generator 322, and the third light generator 332. The plurality of insulating films 3501, 3503, and 3505 and the plurality of color conversion films 3502 and 3504 may be formed on the connection part 350. The connection part 350 may commonly connect the first light generator 312, the second light generator 322, and the third light generator 332.

For example, the first insulating film 3501 is formed on the first conductivity type semiconductor layers 3110, 3210, and 3310 of each of the first light generator 312, the second light generator 322, and the third light generator 332. A second color conversion film 3502 may be formed on the first insulating film 3501, and a second insulating film 3503 may be formed on the second color conversion film 3502. A first color conversion film 3504 may be formed on the second insulating film 3503, and a third insulating film 3505 may be formed on the first color conversion film 3504. For example, the first color conversion film 3504 may include quantum dots or phosphors capable of obtaining green light. For example, the second color conversion film 3502 may include quantum dots or phosphors capable of obtaining red light.

Although the drawing shows that the first color conversion film 3504 is disposed on the second color conversion film 3502, the second color conversion film 3502 may be disposed on the first color conversion film 3504.

Figure 14:
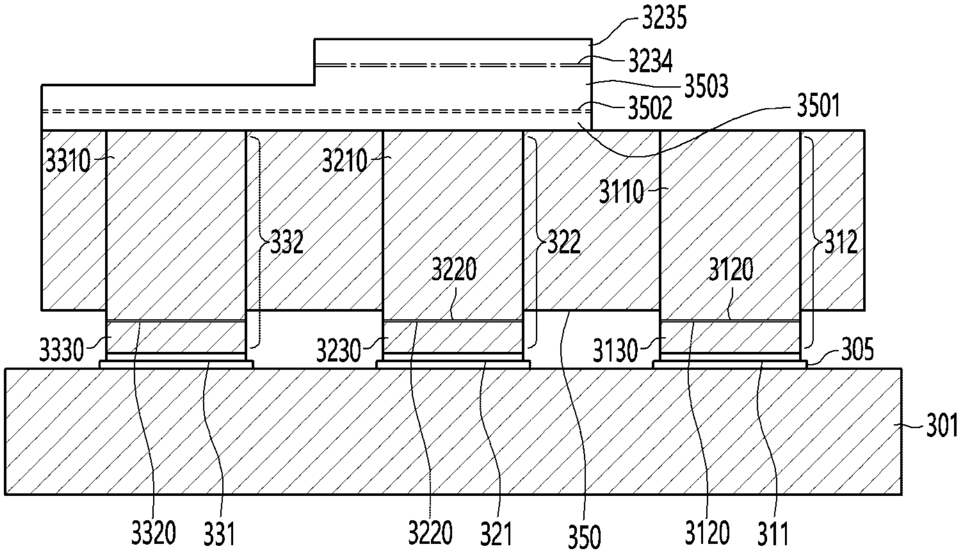

As shown in FIG. 14, some of the first to third insulation layers 3501, 3503, and 3505 and the first and second color conversion layers 3502 and 3504 may be removed by using an etching process.

For example, in the first sub-pixel PX1, all of the first to third insulating films 3501, 3503, and 3505 and the first and second color conversion films 3502 and 3504 on the first light generator 312 may be removed. Accordingly, no color converter may be formed in the first sub-pixel PX1.

For example, in the third sub-pixel PX3, the third insulation layer 3505 and the first color conversion layer 3504 may be removed, and an upper portion of the second insulation layer 3503 may be removed. Accordingly, since the third insulating film 3505 and the first color conversion film 3504 remain only in the second sub-pixel PX2, the third insulating film 3505 may become a third insulation layer 3235 and the first color conversion film 3504 may become a 1-1 color conversion layer 3234.

Figure 15:
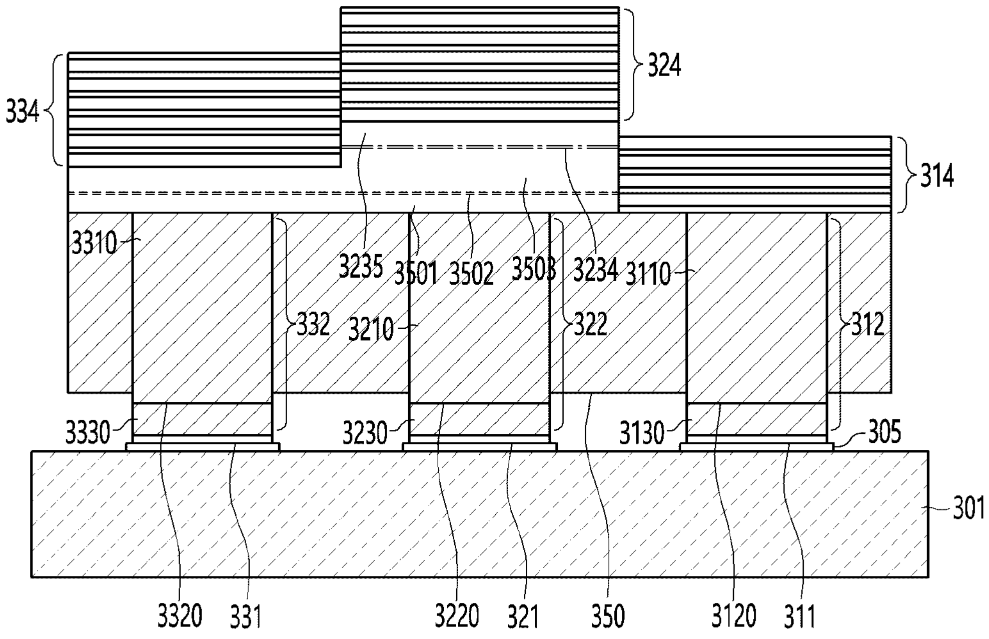

As shown in FIG. 15, a plurality of refraction medium layers are formed in each of the first sub-pixel PX1, the second sub-pixel PX2, and the third sub-pixel PX3 to form a 1-2 reflective layer 314, a 2-2 reflective layer 324 and a 3-2 reflective layer 334. The plurality of refraction medium layers of each of the 1-2 reflective layer 314, the 2-2 reflective layer 324, and the 3-2 reflective layer 334 may have different numbers or thicknesses in consideration of the wavelengths of light incident on each of the 1-2 reflective layer 314, the 2-2 reflective layer 324, and the 3-2 reflective layer 334.

Figure 16:
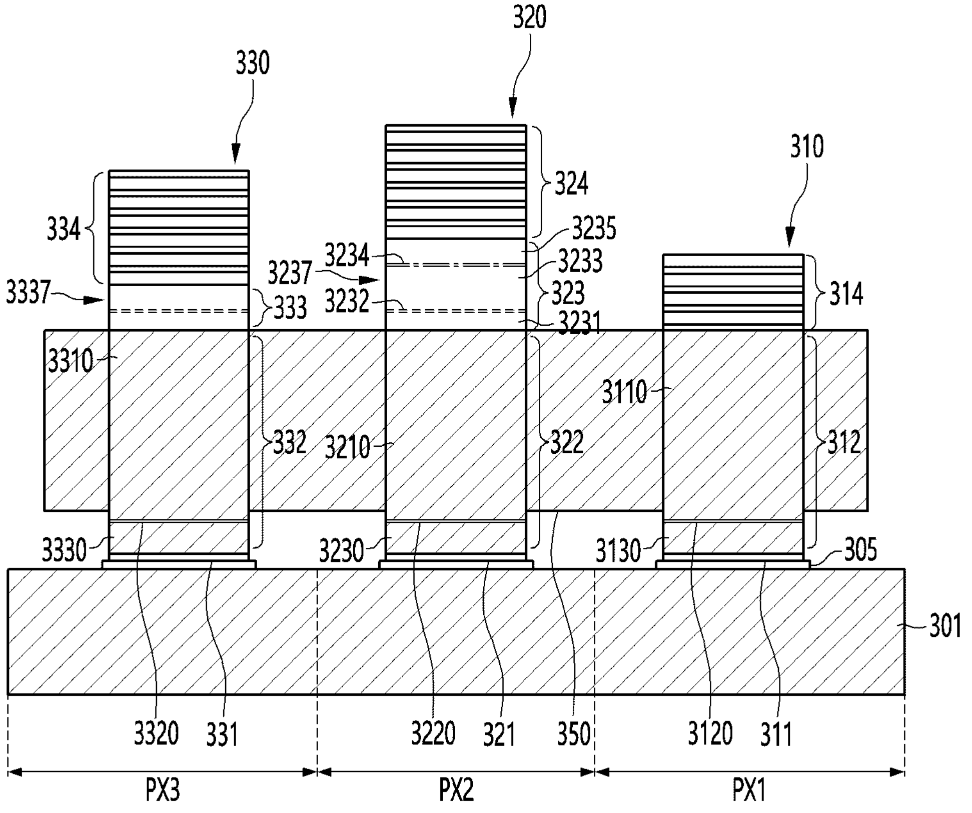

As shown in FIG. 16, the plurality of refraction medium layers, the plurality of insulating films 3501, 3503, and 3505, and the plurality of color conversion films 3502 and 3504 are etched to form a first light resonance structure 310, a second light resonance structure 320, and a third light resonance structure 330. The plurality of refraction medium layers, the plurality of insulating films 3501, 3503, and 3505, and the plurality of color conversion films 3502 and 3504 are etched to form the first insulation layer 3231 of the second light resonance structure 320, the 1-2 color conversion layer 3232 and a second insulation layer 3233. Therefore, the first insulation layer 3231, the 1-2 color conversion layer 3232, the second insulation layer 3233, the 1-1 color conversion layer 3234, and the third insulation layer 3235 may constitute a 2-2 reflective layer 324. The plurality of refraction medium layers, the plurality of insulating films 3501, 3503, and 3505, and the plurality of color conversion films 3502 and 3504 are etched to form a first insulation layer 3331, a second insulation layer 3331 of the third light resonance structure 330, a second color conversion layer 3332 and a second insulation layer 3333. The first insulation layer 3331, the second color conversion layer 3332, and the second insulation layer 3333 may constitute a 3-2 reflective layer 334.

Accordingly, the first light resonance structure 310 may be formed on the first sub-pixel PX1, the second light resonance structure 320 may be formed on the second sub-pixel PX2, and the third light resonance structure 330 may be formed in the third sub-pixel PX3. For example, the first light resonance structure 310 may include the 1-1 reflective layer 311, the first light generator 312, and the 1-2 reflective layer 314. For example, the second light resonance structure 320 may include the 2-1 reflective layer 321, the second light generator 322, the first color converter 323, and the 2-2 reflective layer 324. For example, the third light resonance structure 330 may include the 3-1 reflective layer 331, the third light generator 332, the second color converter 333, and the 3-2 reflective layer 334.

Meanwhile, total reflection layers 3237 and 3337 may be formed on each side portion of the first light resonance structure 310, the second light resonance structure 320, and the third light resonance structure 330 by performing an additional process.

From the above, by performing a series of processes on the substrate 301, the first light resonance structure 310, the second light resonance structure 320 and the third light resonance structure 330 may be formed. Thus, the manufacturing process can be easy and the process can be simple.

The Second Embodiment

Figure 17:
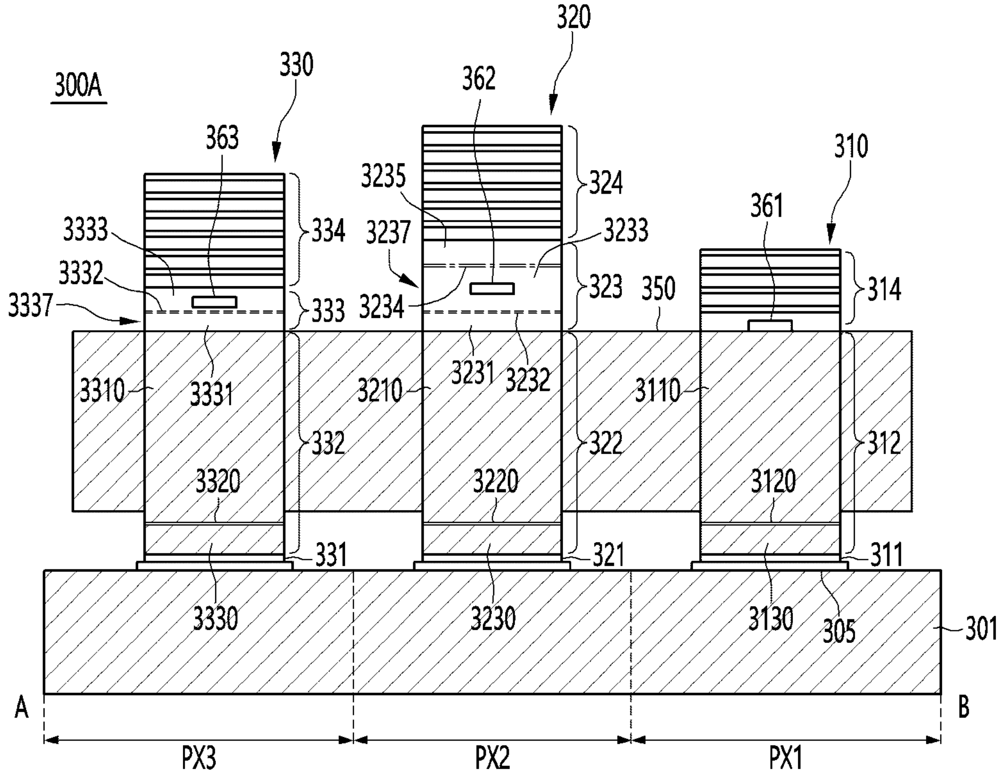
FIG. 17 is a cross-sectional view of a display device according to a second embodiment.

FIG. 17 is a cross-sectional view of a display device according to a second embodiment.

The second embodiment is the same as the first embodiment excluding the high refractive regions 361, 362, and 363 disposed in the first light resonance structure 310, the second light resonance structure 320, and the third light resonance structure 330, respectively. In the second embodiment, the same reference numerals are given to elements having the same shape, structure and/or function as those in the first embodiment, and detailed descriptions will be omitted.

Referring to FIG. 17, a display device 300A according to a second embodiment may comprise a substrate 301, a first light resonance structure 310, a second light resonance structure 320, and a third light resonance structure 330.

For example, the first light resonance structure 310 may include a 1-1 reflective layer 311, a first light generator 312, and a 1-2 reflective layer 314. For example, the second light resonance structure 320 may include a 2-1 reflective layer 321, a second light generator 322, a first color converter 323, and a 2-2 reflective layer 324. For example, the third light resonance structure 330 may include a 3-1 reflective layer 331, a third light generator 332, a second color converter 333, and a 3-2 reflective layer 334.

The display device 300A according to the second embodiment may comprise a connection part 350. The connection part 350 may commonly connect the first light generator 312, the second light generator 322, and the third light generator 332.

The display device 300A according to the second embodiment may comprise high refractive regions 361, 362, and 363.

The high refractive regions 361, 362, and 363 may be cavities that are located at the center and confine a light resonance mode in a horizontal direction. To this end, the high refractive regions 361, 362, and 363 may be located at the center of at least one layer, and the low refractive regions may be located at the rest. For example, the high refractive regions 361, 362, and 363 may have a circular shape when viewed from above, but this is not limited thereto.

For example, the first high refractive region 361 may be disposed in the center between the first light generator 312 and the 1-2 reflective layer 314 in the first light resonance structure 310, but is not limited thereto. Since the first light 560 generated by the first light generator 312 is limited in the first light resonance mode 510 in the horizontal direction by the first high refractive region 361, only the first light resonance mode 510 in the vertical direction may be formed. In this case, total reflection layers 3237 and 3337 of the first embodiment may be omitted, but this is not limited.

For example, the second high refractive region 362 may be located in the first color converter 323 in the second light resonance structure 320. For example, the second high refractive region 362 may be located at the center between the 1-1 color conversion layer 3234 and the 1-2 color conversion layer 3232 of the first color converter 323, but is not limited thereto. Since the first light 560 generated by the second light generator 322 is limited in the first and/or second light resonance modes 520 in the horizontal direction by the second high refractive region 362, only the first and/or second light resonance mode 520 in a vertical direction may be formed. In this case, the total reflection layers 3237 and 3337 of the first embodiment may be omitted, but this is not limited.

For example, the third high refractive region 363 may be located in the second color converter 333 in the third light resonance structure 330. For example, the third high refractive region 363 may be located in a second insulation layer 3333 of the second color converter 333, but is not limited thereto. Since the first light 560 generated by the third light generator 332 is limited in the first and/or third light resonance modes 530 in the horizontal direction by the third high refractive region 363, only the first and/or third light resonance modes 530 in the vertical direction may be formed. In this case, the total reflection layers 3237 and 3337 of the first embodiment may be omitted, but this is not limited.

According to the second embodiment, the high refractive regions 361, 362 and 363 limiting the light resonance mode in the horizontal direction may be disposed on each of the first light resonance structure 310, the second light resonance structure 320 and the third light resonance structure 330. Thus, light efficiency can be improved and luminance can be increased by further activating the light resonance mode in the vertical direction.

The Third Embodiment

Figure 18:
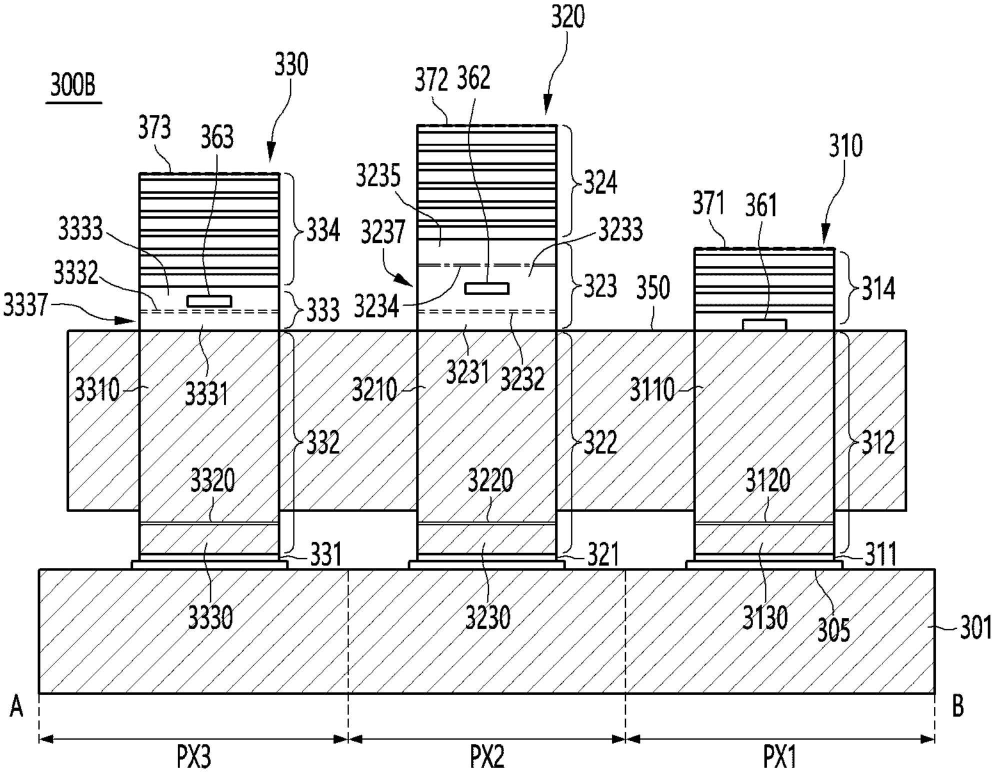
FIG. 18 is a cross-sectional view of a display device according to a third embodiment.

FIG. 18 is a cross-sectional view of a display device according to a third embodiment.

The third embodiment is the same as the second embodiment excluding the collimators 371, 372, and 373. In the third embodiment, the same reference numerals are given to elements having the same shape, structure and/or function as those in the second embodiment, and detailed descriptions will be omitted.

Referring to FIG. 18, a display device 300B according to a third embodiment may comprise a substrate 301, a first light resonance structure 310, a second light resonance structure 320, and a third light resonance structure 330.

For example, the first light resonance structure 310 may include a 1-1 reflective layer 311, a first light generator 312, and a 1-2 reflective layer 314. For example, the second light resonance structure 320 may include a 2-1 reflective layer 321, a second light generator 322, a first color converter 323, and a 2-2 reflective layer 324. For example, the third light resonance structure 330 may include a 3-1 reflective layer 331, a third light generator 332, a second color converter 333, and a 3-2 reflective layer 334.

The display device 300B according to the third embodiment may include a connection part 350. The connection part 350 may commonly connect the first light generator 312, the second light generator 322, and the third light generator 332.

The display device 300B according to the third embodiment may comprise collimators 371, 372, and 373.

The collimators 371, 372, and 373 are disposed on top of each of the first light resonance structure 310, the second light resonance structure 320 and the third light resonance structure 330 to emit light, that is, a first light 560, a second light 570 and a third light 580 in parallel.

For example, the collimators 371, 372, and 373 may be composed of at least one layer or film.

For example, the first collimator 371 may be disposed on a 1-2 reflective layer 314 in the first light resonance structure 310. A first light 560 generated by the first light generator 312 may be emitted as parallel first light 560 by the first collimator 371.

For example, the second collimator 372 may be disposed on a 2-2 reflective layer 324 in the second light resonance structure 320. After a first light 560 generated by the second light generator 322 in the second light resonance structure 320 may be converted into a second light 570 by the first color converter 323, the second light 570 may be emitted by the second collimator 372 in parallel.

For example, the third collimator 373 may be disposed on a 3-2 reflective layer 334 in the third light resonance structure 330. After the first light 560 generated by the third light generator 332 in the third light resonance structure 330 may be converted into a third light 580 by the second color converter 333, the third light 580 may be emitted by the third collimator 373 in parallel.

According to the third embodiment, the collimators 371, 372, and 373 emitting parallel light are provided in the first light resonance structure 310, the second light resonance structure 320, and the third light resonance structure 330, respectively. Since each of the first light 560, the second light 570, and the third light 580 is emitted in parallel, the efficiency of light utilization can be improved by increasing the light condensing performance.

The Fourth Embodiment

Figure 19:
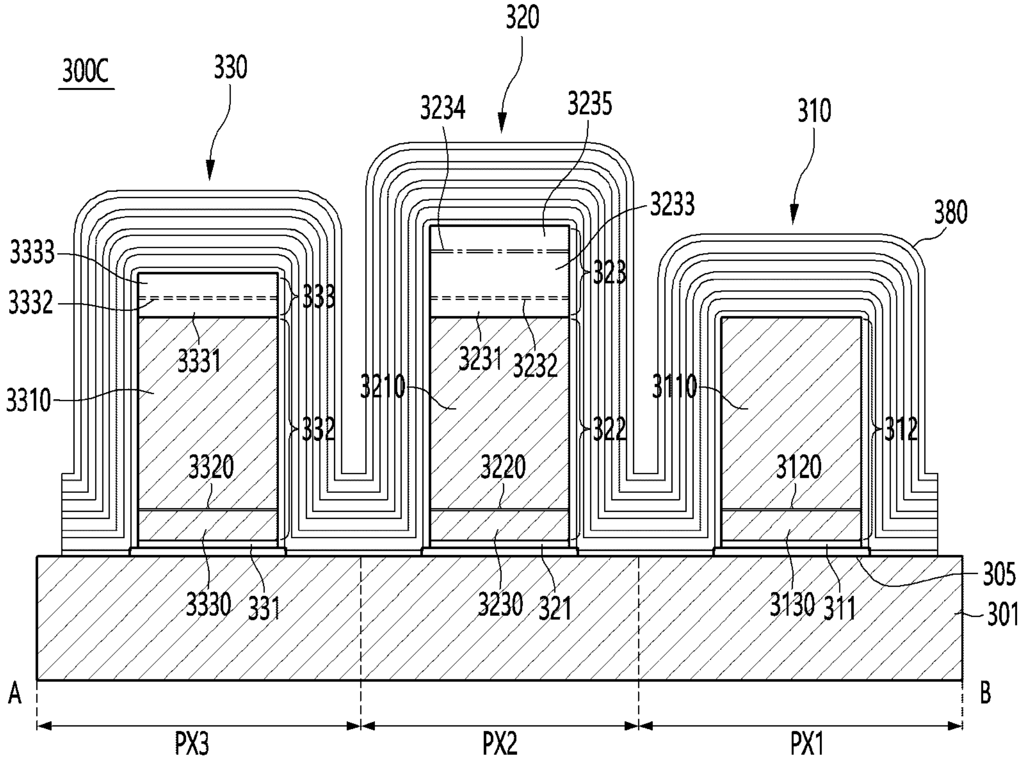
FIG. 19 is a cross-sectional view of a display device according to a fourth embodiment.

FIG. 19 is a cross-sectional view of a display device according to a fourth embodiment.

The fourth embodiment is the same as the first to third embodiments except for the reflective layer 380. In the fourth embodiment, the same reference numerals are given to elements having the same shape, structure and/or function as those in the first to third embodiments, and detailed descriptions will be omitted.

Referring to FIG. 19, a display device 300C according to a fourth embodiment may comprise a substrate 301, a first light resonance structure 310, a second light resonance structure 320, and a third light resonance structure 330.

The display device 300C according to the fourth embodiment may comprise a connection part 350. The connection part 350 may commonly connect a first light generator 312, a second light generator 322, and a third light generator 332.

The display device 300C according to the fourth embodiment may comprise a reflective layer 380. The reflective layer 380 may be integrally disposed on the first light resonance structure 310, the second light resonance structure 320 and the third light resonance structure 330. That is, the reflective layer 380 is not independently disposed on each of the first light resonance structure 310, the second light resonance structure 320 and the third light resonance structure 330.

The reflective layer 380 may surround a first light generator 312 of the first light resonance structure 310. For example, the reflective layer 380 may be disposed along the circumference of the side portion of the first light generator 312 and disposed on the upper side thereof.

The reflective layer 380 may surround the second light generator 322 and a first color converter 323 of the second light resonance structure 320. For example, the reflective layer 380 may be disposed along the circumference of each side portion of the second light generator 322 and the first color converter 323. For example, the reflective layer 380 may be disposed on the upper side of the first color converter 323.

The reflective layer 380 may surround the third light generator 332 and a second color converter 333 of the third light resonance structure 330. For example, the reflective layer 380 may be disposed along the circumference of each side portion of the third light generator 332 and the second color converter 333. For example, the reflective layer 380 may be disposed on the upper side of the second color converter 333.

For example, the reflective layer 380 may be disposed between the first light resonance structure 310, the second light resonance structure 320 and the third light resonance structure 330.

According to the fourth embodiment, the reflective layer 380 may be integrally disposed on the first light resonance structure 310, the second light resonance structure 320, and the third light resonance structure 330. Thus, since it is not necessary to separately pattern the reflective layer 380, a process can be simplified and a process time can be reduced.

According to the fourth embodiment, the reflective layer 380 may be disposed between the first light resonance structure 310, the second light resonance structure 320, and the third light resonance structure 330. Thus, the first light 560 of the first light resonance structure 310, the second light 570 of the second light resonance structure 320, and the third light 580 of the third light resonance structure 330 can be prevented from being emitted in the lateral direction. Accordingly, since each of the first light 560, the second light 570, and the third light 580 is emitted in a vertical direction, luminance may be increased by improving light efficiency. In addition, unlike the first to third embodiments, since the total reflection layers 3237 and 3337 are not required, the structure is simple, the process time is reduced, and the cost can be reduced.

The Fifth Embodiment

Figure 20:
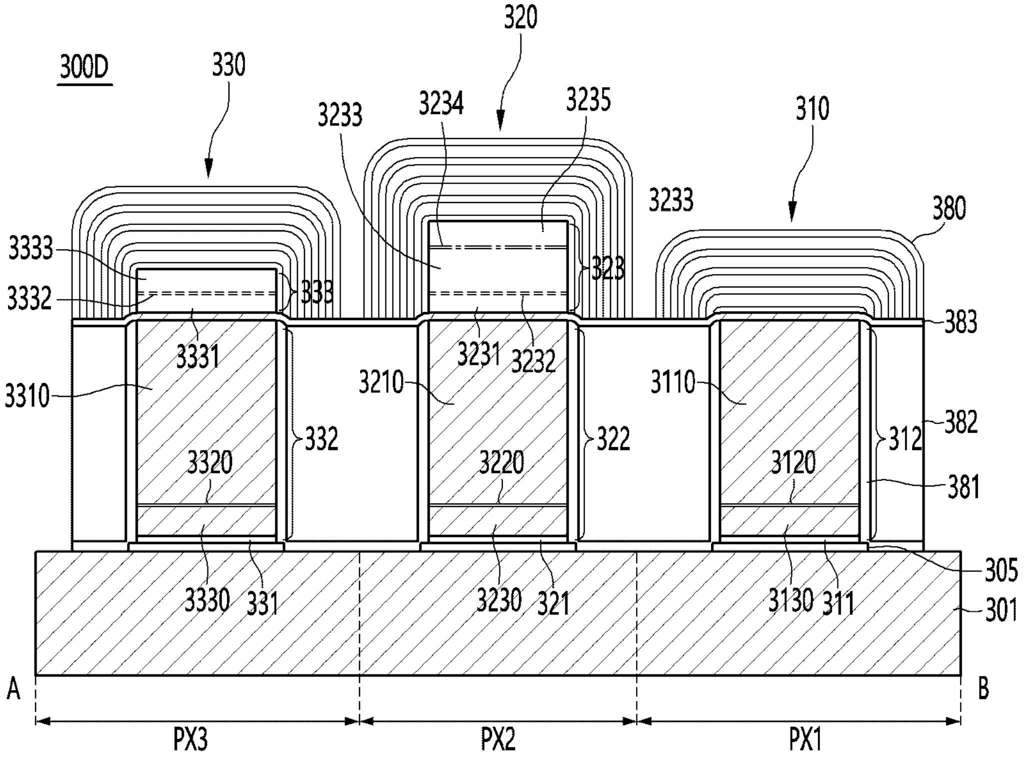
FIG. 20 is a cross-sectional view of a display device according to a fifth embodiment.

FIG. 20 is a cross-sectional view of a display device according to a fifth embodiment.

The fifth embodiment is similar to the first to fourth embodiments except for the passivation layer 381, the planarization layer 382 and the transparent conductive layer 383. In the fifth embodiment, the same reference numerals are given to components having the same shape, structure and/or function as those in the first to fourth embodiments, and detailed descriptions will be omitted.

Referring to FIG. 20, a display device 300D according to a fifth embodiment may comprise a substrate 301, a first light resonance structure 310, a second light resonance structure 320, and a third light resonance structure 330.

The display device 300D according to the fifth embodiment may comprise a passivation layer 381. The passivation layer 381 may be disposed along the circumference of the side portion of each of the first light generator 312, the second light generator 322, and the third light generator 332.

According to the fifth embodiment, since a first light of the first light generator 312, a second light of the second light generator 322, and/or a third light of the third light generator 332 may be not emitted by the passivation layer 381 in the horizontal direction. the luminance can be improved by increasing the amount of light emitted in the vertical direction. In addition, since leakage current flowing along the side portion of the first light generator 312 is blocked by the passivation layer 381, a decrease in luminance can be prevented, and an electrical short between the first conductivity type semiconductor layers 3110, 3210, and 3310 and the second conductivity type semiconductor layer 3130, 3230, 3330 can be prevented.

Meanwhile, in the display device 300D according to the fifth embodiment, a planarization layer 382 may be disposed between the first light generator 312, the second light generator 322, and the third light generator 332. For example, the planarization layer 382 may be disposed in a groove formed by the passivation layer 381. The planarization layer 382 may be more easily formed than the reflective layer 380. The reflective layer 380 may include a plurality of refraction medium layers. When the thickness of each of the plurality of refraction medium layers is thin, it is very difficult to form each of the plurality of refraction medium layers to have a uniform thickness. In particular, since the depth of the groove formed by the passivation layer 381 is large, it is difficult to form a plurality of refraction medium layers in the groove. Accordingly, the planarization layer 382 in the groove formed by the passivation layer 381 may be disposed. Thus, each of the plurality of refraction medium layers constituting the reflective layer 380 may be formed to have a uniform thickness.

The display device 300D according to the fifth embodiment may comprise a transparent conductive layer 383.

The light generated by each of the first light generator 312, the second light generator 322, and the third light generator 332 is emitted to the outside, or is transmitted to the first color converter 323 and/or the second color converter 333. Thus, the transparent conductive layer 383 may be formed of a transparent conductive material. For example, the transparent conductive layer 383 may include, for example, ITO, IZO, etc., but is not limited thereto.

The transparent conductive layer 383 may be disposed on the first light generator 312, the second light generator 322, the third light generator 332 and the planarization layer 382. The transparent conductive layer 383 may be a cathode electrode for supplying voltage (or current) to a first conductivity type semiconductor layers 3110, 3210, and 3310 of each of the first light generator 312, the second light generator 322, and the third light generator 332.

A first color converter 323 may be disposed on the transparent conductive layer 383 corresponding to the second light generator 322 in the second light resonance structure 320. A second color converter 333 may be disposed on the transparent conductive layer 383 corresponding to the third light generator 332 in the third light resonance structure 330.

The reflective layer 380 may be disposed on the transparent conductive layer 383, the first color converter 323 and the second color converter 333. For example, the reflective layer 380 may surround each of the first color converter 323 and the second color converter 333.

Meanwhile, although not shown in the drawings in the first to fifth embodiments, color filters may be disposed on the second light resonance structure 320 and the third light resonance structure 330, but are not limited thereto. A color filter may or may not be disposed on the first light resonance structure 310. When the blue wavelength band of the first light 560 is different from the target wavelength band, a color filter having a target wavelength band on the first light resonance structure 310 may disposed on the first light resonance structure 310. In this case, only blue light corresponding to a target wavelength band among the first light 560 generated by the first light generator 312 may be emitted.

The Sixth Embodiment

Figure 21:
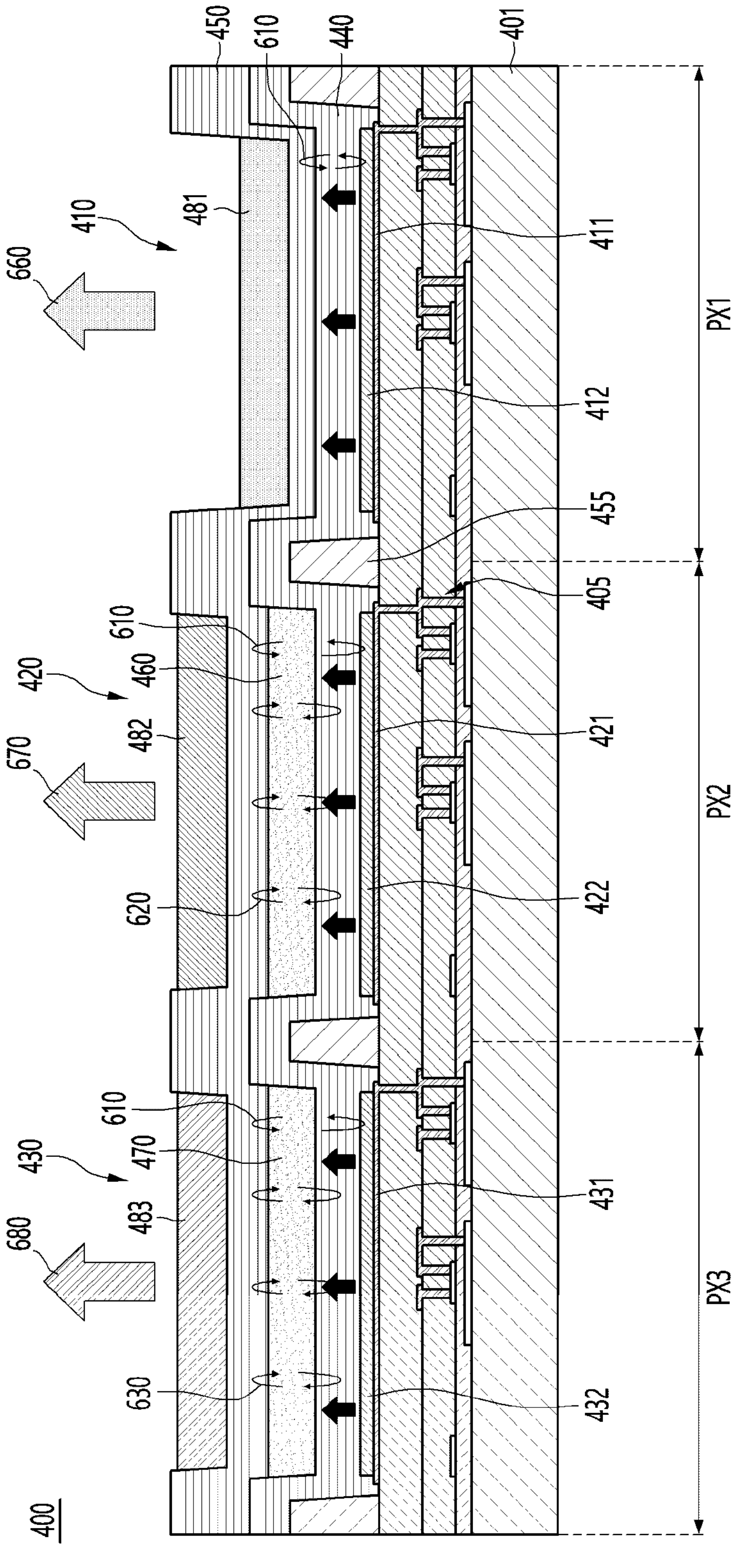
FIG. 21 is a cross-sectional view of a display device according to a sixth embodiment.

FIG. 21 is a cross-sectional view of a display device according to a sixth embodiment.

Referring to FIG. 21, a display device 400 according to a sixth embodiment may comprise a substrate 401, a first light resonance structure 410, a second light resonance structure 420, a third light resonance structure 430, and a barrier rib 455. Here, the barrier rib 455 may be referred to as a barrier, a dam, or a bank.

The substrate 401 may comprise a driving circuit 405 disposed on each of a first sub-pixel PX1, a second sub-pixel PX2, and a third sub-pixel PX3. The substrate 401 may be a rigid substrate, a flexible substrate, a stretchable substrate or the like.

The first light resonance structure 410 may emit a first light 660 using a first light resonance mode 510. The first light resonance structure 410 may include a first light generator 412, first light resonance mode generators 440 and 450 and a first color filter 481.

The first light generator 412 may generate the first light 660. The first light 660 may include blue light, but is not limited thereto. The first light resonance mode generators 440 and 450 form the first light resonance mode 610, and amplify the first light 660 generated by the first light generator 412 using the first light resonance mode 610. Accordingly, the amount of light of the first light 660 emitted from the first light resonance structure 410 is further increased, and thus the luminance of the first light 660 may be improved. Since the first color filter 481 does not have a filter function, the wavelength of the first light 660 amplified by the first light resonance mode 610 generator is not filtered and then the first light 660 can be emitted, but is not limited thereto.

The second light resonance structure 420 may emit a second light 670 using a second light resonance mode 620. The second light resonance structure 420 may include a second light generator 422, a first color converter 460, second light resonance mode generators 440 and 450, and a second color filter 482.

The second light generator 422 may generate the first light 660. The first color converter 460 may convert the first light 660 into the second light 670. The second light 670 may include green light, but is not limited thereto. The second light resonance mode generators 440 and 450 form the second light resonance mode 620, and amplify the first light 660 generated by the first light generator 412 using the second light resonance mode 620 to supply the amplified first light 660 to the first color converter 460. Accordingly, the amount of light of the second light 670 converted by the first color converter 460 may be further increased. In addition, since energy of the first light is maximally absorbed by the first color converter 460 using the second light resonance mode 620, the conversion efficiency of the first color converter 460 can be improved, and then the second light 670 can be improved. The second color filter 482 may have a filtering function to remove wavelengths other than the green wavelength band. That is, the second color filter 482 may emit only the green wavelength band from among the second light 670 generated by the second light resonance mode generators 440 and 450.

The third light resonance structure 430 may emit a third light 680 using a third light resonance mode 630. The third light resonance structure 430 may include a third light generator 432, a second color converter 470, third light resonance mode generators 440 and 450, and a third color filter 483.

The third light generator 432 may generate the first light 660. The second color converter 470 may convert the first light 660 into the third light 680. The third light 680 may include red light, but is not limited thereto. The third light resonance mode generators 440 and 450 form the third light resonance mode 630, and amplify the first light 660 generated by the first light generator 412 using the third light resonance mode 630 to supply the amplified first light 660 to the second color converter 470. Accordingly, the amount of light of the third light 680 converted by the second color converter 470 may be further increased. In addition, since the energy of the first light 660 is maximally absorbed in the second color converter 470 using the third light resonance mode 630, the conversion efficiency of the second color converter 470 can be improved and then the luminance of the light 680 can be improved. The third color filter 483 may have a filtering function of removing wavelength other than the red wavelength band. That is, the third color filter 483 may emit only the red wavelength band among the third light 680 generated by the third light resonance mode generators 440 and 450.

On the other hand, each of the first light resonance mode generators 440 and 450, the second light resonance mode generators 440 and 450, and the third light resonance mode generators 440 and 450 may comprise a first reflective layer 440 and a second reflective layer 450. For example, the first reflective layer 440 may be commonly disposed on the first light resonance mode generators 440 and 450, the second light resonance mode generators 440 and 450, and the third light resonance mode generators 440 and 450. That is, the first reflective layer 440 may be disposed on the entire area of the substrate 401. For example, the second reflective layer 450 may be commonly disposed on the first light resonance mode generators 440 and 450, the second light resonance mode generators 440 and 450, and the third light resonance mode generators 440 and 450. That is, the second reflective layer 450 may be disposed on the entire area of the substrate 401. For example, each of the first reflective layer 440 and the second reflective layer 450 may have a DBR structure. Since this DBR structure has been described in detail in the first embodiment, detailed descriptions will be omitted.

For example, the first reflective layer 440 may completely reflect each of the first light 660, the second light 670, and the third light 680, that is, 100%. For example, the second reflective layer 450 may selectively reflect the first light 660 in the first light resonance structure 410. For example, the second reflective layer 450 may completely reflect the first light 660 and selectively reflect the second light 670 in the second light resonance structure 420. For example, the second reflective layer 450 may completely reflect the first light 660 and selectively reflect the third light 680 in the third light resonance structure 430.

For example, in the first light resonance structure 410, the first light 660 may be completely reflected by the first reflective layer 440 and partially reflected by the second reflective layer 450. Accordingly, a portion of the first light 660 may be emitted to the outside by the second reflective layer 450.

For example, in the second light resonance structure 420, the first light 660 is completely reflected by each of the first reflective layer 440 and the second reflective layer 450, and the second light 670 is reflected by the first reflective layer 440 and partially reflected by the second reflective layer 450. Accordingly, a part of the second light 670 may be emitted to the outside by the second reflective layer 450.

For example, in the third light resonance structure 430, the first light 660 may be completely reflected by each of the first reflective layer 440 and the second reflective layer 450, and the third light 680 may be reflected in the first light 680. It may be completely reflected by the reflective layer 440 and partially reflected by the second reflective layer 450. Accordingly, a portion of the third light 680 may be emitted to the outside by the second reflective layer 450.

Meanwhile, unlike the first to fifth embodiments, in the sixth embodiment, barrier ribs 455 may be disposed between the first light resonance structure 410, the second light resonance structure 420, and the third light resonance structure 430.

The barrier ribs 455 may be disposed on the same layer as the first light generator 412, the second light generator 422, and the third light generator 432, but is not limited thereto.

The thickness (or height) of the barrier rib 455 may be greater than the thickness (or height) of each of the first light generator 412, the second light generator 422, and the third light generator 432. Each of the first reflective layer 440 and the second reflective layer 450 may be disposed on the barrier ribs 455 as well as the first light generator 412, the second light generator 422, and the third light generator 432.

For example, the respective heights of the first reflective layer 440 and the second reflective layer 450 positioned on the barrier ribs 455 may be greater than each of the respective heights of the first reflective layer 440 and the second reflective layer 450 positioned on the first light generator 412, the second light generator 422, and the third light generator 432, respectively. Accordingly, the first reflective layer 440 may include a first groove formed by the barrier rib 455 in an area between the barrier rib 455, that is, in each of the first sub-pixel PX1, the second sub-pixel PX2, and the third sub-pixel PX3. The first color converter 460 and the second color converter 470 may be disposed in the first groove. In addition, the second reflective layer 450 may include a second groove formed by the barrier rib 455 in each of the first sub-pixel PX1, the second sub-pixel PX2, and the third sub-pixel PX3. The first color filter 481, the second color filter 482, and the third color filter 483 may be disposed in the second groove.

Meanwhile, each of the first light generator 412, the second light generator 422, and the third light generator 432 may be electrically connected to the driving circuit 405 through anode electrodes 411, 421, and 431. The anode electrodes 411, 421, and 431 may include a reflective layer having a reflective characteristic. The anode electrodes 411, 421, and 431 may be included in each of the first light generator 412, the second light generator 422, and the third light generator 432, but are not limited thereto.

Although not shown, each of the first light generator 412, the second light generator 422, and the third light generator 432 may be electrically connected to a cathode electrode. For example, the cathode electrode may be commonly connected to the first light generator 412, the second light generator 422, and the third light generator 432, but is not limited thereto.

The descriptions omitted in the sixth embodiment can be easily understood in the first to fifth embodiments.

According to the sixth embodiment, the amount of light of each of the first light 660, the second light 670 and the third light 680 by using each of the first light resonance mode 610, the second light resonance mode 620, and the third light resonance mode 630 may be increased and then the luminance can be improved.

The Seventh Embodiment

Figure 22:
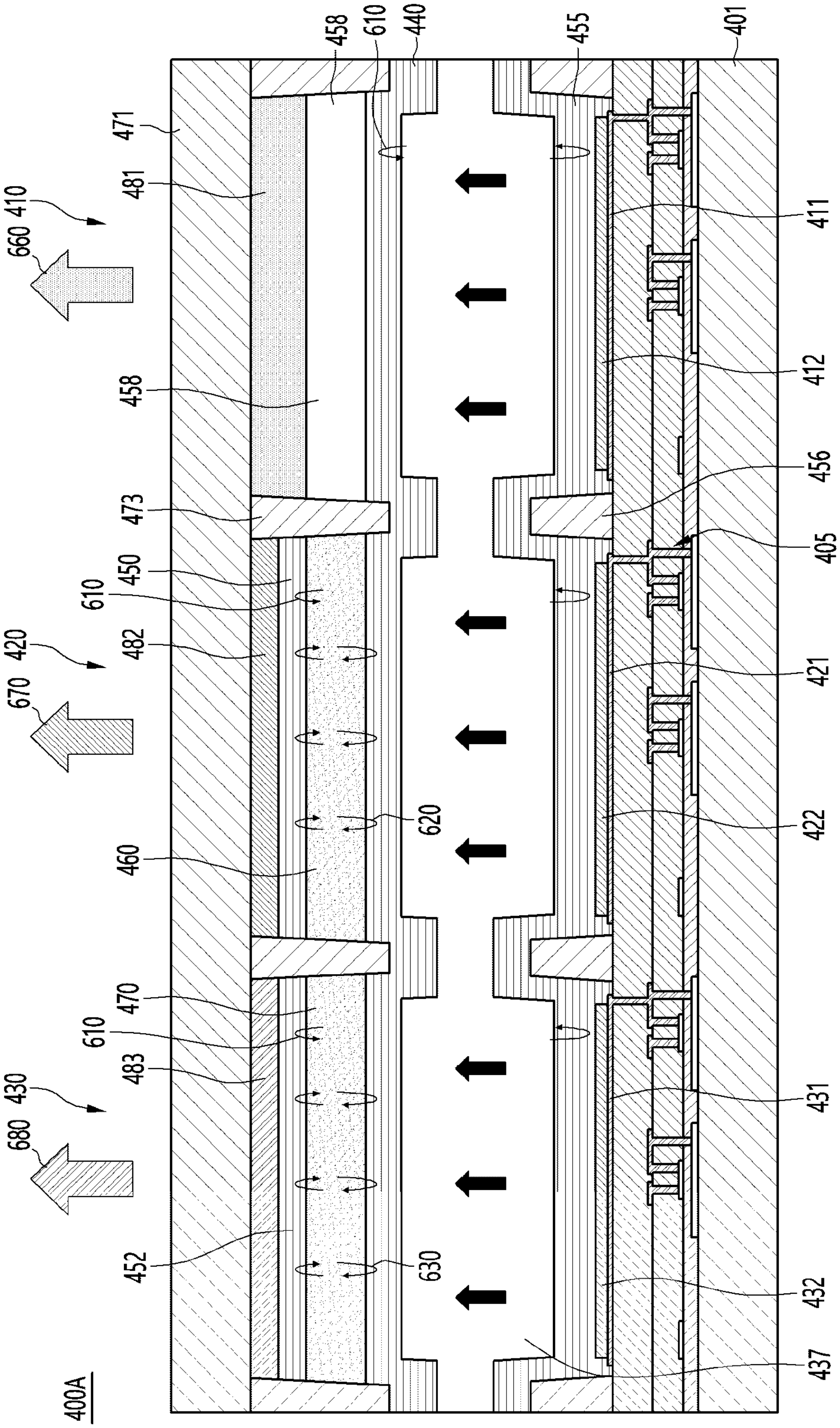
FIG. 22 is a cross-sectional view of a display device according to a seventh embodiment.

FIG. 22 is a cross-sectional view of a display device according to a seventh embodiment. The seventh embodiment is similar to the sixth embodiment except for the third reflective layer 455. In the seventh embodiment, the same reference numerals are given to elements having the same shape, structure and/or function as those in the sixth embodiment, and detailed descriptions will be omitted.

Referring to FIG. 22, a display device 400A according to a seventh embodiment may comprise a first substrate 401, a first light resonance structure 410, a second light resonance structure 420, and a third light resonance structure 430, a first barrier rib 456, a second barrier rib 473, and a second substrate 471. Here, each of the first barrier rib 456 and the second barrier rib 473 may be referred to as a barrier, a dam, or a bank.

The first light resonance structure 410, the second light resonance structure 420, and the third light resonance structure 430 may be disposed between a first substrate 401 and a second substrate 471. The first substrate 401 may support the first light resonance structure 410, the second light resonance structure 420 and the third light resonance structure 430, and the second substrate 471 may protect the first light resonance structure 410, the second light resonance structure 420 and the third light resonance structure 430. The second substrate 471 may be an insulation layer made of an organic material or an inorganic material. The second substrate 471 may be made of a material having excellent light transmittance.

Meanwhile, an insulation layer 437 may be empty or filled with a specific medium. The first substrate 401 and the second substrate 471 may be separated based on the insulation layer 437. In this case, a driving circuit 405, a first light generator 412, a second light generator 422, a third light generator 432, a first barrier rib 456 and a third reflective layer 455 are formed on the first substrate 401. A first color filter 481, a second color filter 482, a third color filter 483, second reflective layers 450 and 452, a second barrier rib 473, and an insulation layer 458, a first color converter 460, a second color converter 470 and a first reflective layer 440 may be formed on the second substrate 471. Since no color converter is provided in the first light resonance structure 410, the height of the first color filter 481 may be lower than the respective heights of the color filter 482 and the third color filter 483 disposed on each of the second light resonance structure 420 and the third light resonance structure 430. In order to compensate for this, the second barrier rib 473 and/or the insulation layer 458 may be provided, but may be omitted.

Then, after the second substrate 471 is turned over, the first substrate 401 and the second substrate 471 may be bonded together. Thus, a display device 400A comprising the second light resonance structure 420 and the third light resonance structure 430 may be manufactured.

For example, the first reflective layer 440 may be commonly disposed on the first sub-pixel PX1, the second sub-pixel PX2, and the third sub-pixel PX3. The third reflective layer 455 may be commonly disposed on the first sub-pixel PX1, the second sub-pixel PX2, and the third sub-pixel PX3. The second reflective layers 450 and 452 may be independently disposed on the second sub-pixel PX2 and the third sub-pixel PX3.

Meanwhile, each of the first light resonance structure 410, the second light resonance structure 420, and the third light resonance structure 430 may be divided by the first barrier rib 456 and the second barrier rib 473. That is, each of the first barrier rib 456 and the second barrier rib 473 may be disposed between the first light resonance structure 410, the second light resonance structure 420, and the third light resonance structure 430. The first barrier rib 456 disposed on the first substrate 401 and the second barrier rib 473 disposed on the second substrate 471 may be vertically disposed to face each other.

The third reflective layer 455 disposed on the first substrate 401 may include a first groove by the first barrier rib

456 in each of the first sub-pixel PX1, the second sub-pixel PX2, and the third sub-pixel PX3. The first reflective layer 440 disposed on the second substrate 471 may include a second groove by the second barrier rib 473 in each of the first sub-pixel PX1, the second sub-pixel PX2, and the third sub-pixel PX3. When the first substrate 401 and the second substrate 471 are bonded together, the third reflective layer 455 on the first barrier rib 456 and the first reflective layer 440 on the second barrier rib 473 may be attached to each other and sealed. Accordingly, the insulation layer 437 having an empty space may be formed by the first groove and the second groove.

Meanwhile, in the first light resonance structure 410, the first light resonance mode generator may be configured by the first reflection layer 440 and the third reflection layer 455. That is, the light generated by the first light generator 412 may be completely reflected by the third reflective layer 455 and partially reflected by the first reflective layer 440. Therefore, the first light resonance mode 610 is formed between the first reflective layer 440 and the third reflective layer 455. After the first light 660 generated the first light generator 412 is amplified by the first light resonance mode 610 and passes through the first reflective layer 440, the first light 660 may emit to the outside through the first color filter 481.

In the second light resonance structure 420, the first light 660 generated by the second light generator 422 may be amplified by the first reflective layer 440 and the third reflective layer 455. In addition, since a second light resonance mode 620 is formed between the first reflective layer 440 and the second reflective layer 450, and the energy of the first light 660 is maximally absorbed by the second light resonance mode 620 in the first color converter 460, the conversion efficiency of the second light 670 in the first color converter 460 can be improved, and thus luminance of the second light 670 can be improved.

In the third light resonance structure 430, the first light 660 generated by the second light generator 422 may be amplified by the first reflective layer 440 and the third reflective layer 455. In addition, since a third light resonance mode 630 is formed between the first reflective layer 440 and the second reflective layer 452, and the energy of the first light 660 is maximally absorbed in the second color converter 470 by the third light resonance mode 630, conversion efficiency of the third light 680 in the second color converter 470 can be improved, and thus luminance of the third light 680 can be improved.

According to the seventh embodiment, the amount of light of each of the first light 660, the second light 670 and the third light 680 by using each of the first light resonance mode 610, the second light resonance mode 620, and the third light resonance mode 630 may be increased and then the luminance can be improved.

The above detailed description should not be construed as limiting in all respects and should be considered illustrative. The scope of the embodiment should be determined by reasonable interpretation of the appended claims, and all changes within the equivalent range of the embodiment are included in the scope of the embodiment.

INDUSTRIAL APPLICABILITY

The embodiment can be adopted in the display field for displaying images or information.

The embodiment can be adopted in the display field for displaying images or information using a semiconductor light emitting device. The semiconductor light emitting device may be a micro-level semiconductor light emitting device or a nano-level semiconductor light emitting device.

The invention claimed is:

1. A display device, comprising:

a substrate including a first sub-pixel, a second sub-pixel, and a third sub-pixel, the first sub-pixel, the second sub-pixel, and the third sub-pixel constituting a pixel;

a first light resonance structure disposed in the first sub-pixel and configured to emit a first light using a first light resonance mode;

a second light resonance structure disposed in the second sub-pixel and configured to emit a second light using a second light resonance mode; and a third light resonance structure disposed in the third sub-pixel and configured to emit a third light using a third light resonance mode, wherein the first light resonance structure includes a first light resonance mode generator and a first light generator disposed in the first light resonance mode generator, wherein the second light resonance structure includes a second light resonance mode generator, a second light generator in the second light resonance mode generator, and a first color converter disposed on the second light generator, wherein the first light resonance mode generator comprises:

a 1-1 reflective layer on the substrate; and a 1-2 reflective layer on the 1-1 reflective layer, and wherein the first light generator is disposed between the 1-1 reflective layer and the 1-2 reflective layer, wherein the second light resonance mode generator comprises:

a 2-1 reflective layer on the substrate, and a 2-2 reflective layer on the 2-1 reflective layer, wherein the second light generator is disposed between the 2-1 reflective layer and the 2-2 reflective layer, and wherein the first color converter is disposed between the second light generator and the 2-2 reflective layer.

2. The display device of claim 1, wherein the third light resonance structure comprises:

a third light resonance mode generator;

a third light generator in the third light resonance mode generator; and a second color converter on the third light generator, wherein the third light resonance mode generator comprises:

a 3-1 reflective layer on the substrate; and a 3-2 reflective layer on the 3-1 reflective layer, wherein the third light generator is disposed between the 3-1 reflective layer and the 3-2 reflective layer, and wherein the second color converter is disposed between the third light generator and the 3-2 reflective layer.

3. The display device of claim 2, wherein the 1-2 reflective layer, the 2-2 reflective layer and the 3-2 reflective layer include a DBR structure.

4. The display device of claim 2, wherein the first light generator, the second light generator, and the third light generator include an active layer generating the first light.

5. The display device of claim 4, wherein the first color converter includes a 1-1 color conversion layer converting the first light into the second light.

6. The display device of claim 3, wherein the first color converter includes a 1-2 color conversion layer disposed between the active layer and the 1-1 color conversion layer.

7. The display device of claim 6, wherein the second color converter includes a second color conversion layer converting the first light into the third light.

8. The display device of claim 7, wherein the 1-2 color conversion layer and the second color conversion layer are disposed on the same layer.

9. The display device of claim 7, wherein the first light resonance mode is formed between the 1-1 reflective layer and the 1-2 reflective layer, the second light resonance mode is formed between the 2-1 reflective layer and the 2-2 reflective layer, and the third light resonance mode is formed between the 3-1 reflective layer and the 3-2 reflective layer.

10. The display device of claim 9, wherein an anti-node of the first light resonance mode is located in the active layer.

11. The display device of claim 10, wherein the anti-node of the first light resonance mode is located in the 1-1 color conversion layer, and a node of the first light resonance mode is located in the 1-2 color conversion layer.

12. The display device of claim 10, wherein an anti-node of the second light resonance mode is located in the 1-1 color conversion layer.

13. The display device of claim 10, wherein the anti-node of the first light resonance mode is located in the second color conversion layer, and an anti-node of the third light resonance mode is located in the second color conversion layer.

14. The display device of claim 2, wherein the first light generator, the second light generator, and the third light generator comprise:

a first conductivity type semiconductor layer on one side of an active layer; and a second conductivity type semiconductor layer on the other side of the active layer.

15. The display device of claim 14, wherein the first light generator, the second light generator, and the third light generator comprise a connection part, and at least one semiconductor layer of the first conductivity type semiconductor layer or the second conductivity type semiconductor layer of the first light generator, the second light generator, and the third light generator is commonly connected by the connection part.

16. The display device of claim 1, wherein the first light resonance structure, the second light resonance structure, and the third light resonance structure include a high refractive region located at a center thereof.

17. The display device of claim 1, wherein the first light resonance structure, the second light resonance structure, and the third light resonance structure include a total reflection layer located on a side portion thereof.

18. The display device of claim 1, wherein the first light includes blue light, the second light includes green light, and the third light includes red light.

* * * * *